(12) United States Patent
Byeon et al.

(10) Patent No.: US 9,374,927 B2
(45) Date of Patent: Jun. 21, 2016

(54) DISPLAY DEVICE

(71) Applicant: LG ELECTRONICS INC., Seoul (KR)

(72) Inventors: Jonghyun Byeon, Seoul (KR); Byungkil Lim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/153,197

(22) Filed: Jan. 13, 2014

(65) Prior Publication Data

US 2014/0198474 A1    Jul. 17, 2014

(30) Foreign Application Priority Data

Jan. 17, 2013  (KR) .................. 10-2013-0005595

(51) Int. Cl.
*H05K 7/18* (2006.01)
*G02F 1/1333* (2006.01)

(52) U.S. Cl.
CPC .......... *H05K 7/183* (2013.01); *G02F 1/133308* (2013.01); *G02F 2001/133314* (2013.01); *G02F 2001/133322* (2013.01); *G02F 2001/133325* (2013.01); *G02F 2201/46* (2013.01)

(58) Field of Classification Search
CPC .............. G02F 1/133308; G02F 2001/133314; G02F 2001/133325; G02F 2201/46; G02F 2001/133322; H05K 7/183
USPC .......................................... 361/809, 717, 810
See application file for complete search history.

(56) References Cited

U.S. PATENT DOCUMENTS

| | | | | |
|---|---|---|---|---|
| 4,211,382 A * | 7/1980 | Bonfils | .................. | A47G 1/168 248/467 |
| 4,914,550 A * | 4/1990 | Filsinger | .............. | H05K 7/1409 361/715 |
| 5,563,767 A * | 10/1996 | Chen | .................... | G11B 33/124 361/679.31 |
| 7,113,220 B1 * | 9/2006 | Misawa et al. | ................ | 348/376 |
| 8,387,632 B2 * | 3/2013 | Saito | ............................ | 134/116 |
| 8,602,081 B2 * | 12/2013 | Komatsu et al. | ........... | 160/273.1 |
| 8,899,700 B2 * | 12/2014 | Hsu | ........................ | G06F 1/187 312/223.2 |

(Continued)

FOREIGN PATENT DOCUMENTS

| | | | | |
|---|---|---|---|---|
| DE | WO 2012065604 A1 * | 5/2012 | ............. | B60R 11/04 |
| JP | 2010-45557 A | 2/2010 | | |
| JP | 2010045557 A * | 2/2010 | | |

OTHER PUBLICATIONS

European Search Report issued in a related foreign application No. 14000125.6 dated May 9, 2014.

*Primary Examiner* — Jerry Wu
*Assistant Examiner* — Stephen Sul
(74) *Attorney, Agent, or Firm* — KED & Associates, LLP

(57) ABSTRACT

A display device includes a display panel, a frame positioned in the rear of the display panel, a back cover positioned in the rear of the frame, and a fastening part which is positioned between the back cover and the frame and connects the back cover to the frame. The fastening part includes a base part, a moving part which is movably connected to the base part and includes a first hook, a spring part having one end connected to the base part and the other end connected to the moving part, a handle part which is movably connected to the base part and changes a length of the spring part by a rotation of the handle part, and a connection part including a second hook corresponding to the first hook of the moving part.

19 Claims, 52 Drawing Sheets

(56) References Cited

U.S. PATENT DOCUMENTS

| | | | | |
|---|---|---|---|---|
| 2005/0127260 A1* | 6/2005 | Dittmer | ............... | F16M 11/04 248/221.11 |
| 2005/0152106 A1* | 7/2005 | Coster | ............... | G06F 1/181 361/679.58 |
| 2008/0132120 A1* | 6/2008 | Tsai | ............... | G06K 7/0021 439/630 |
| 2010/0011644 A1* | 1/2010 | Kramer | ............... | 40/711 |
| 2011/0116273 A1* | 5/2011 | Kasai | ............... | 362/311.01 |
| 2012/0092585 A1* | 4/2012 | Byeon | ............... | G02F 1/133308 349/58 |
| 2012/0314346 A1* | 12/2012 | Chao | ............... | H05K 5/02 361/679.01 |
| 2014/0043528 A1* | 2/2014 | Barthel | ............... | B60R 11/04 348/373 |

\* cited by examiner (A)

(B)

(A)

(B)

DISPLAY DEVICE

CROSS-REFERENCE TO RELATED APPLICATION

This application claims priority under 35 U.S.C. §119 to Korean Patent Application No. 10-2013-0005595 filed on Jan. 17, 2013, whose entire disclosure is hereby incorporated by reference.

BACKGROUND

1. Field

Embodiments of the disclosure relate to a display device.

2. Background

With the development of the information society, various demands for display devices have been increasing. Various display devices, such as liquid crystal displays (LCDs), plasma display panels (PDPs), electroluminescent displays (ELDs), and vacuum fluorescent displays (VFDs), have been recently studied and used to meet various demands for the display devices. Among the display devices, a liquid crystal display panel of the liquid crystal display includes a liquid crystal layer, and a thin film transistor (TFT) substrate and a color filter substrate which are positioned opposite each other with the liquid crystal layer interposed therebetween. The liquid crystal display panel displays an image using light provided by a backlight unit of the liquid crystal display.

BRIEF DESCRIPTION OF THE DRAWINGS

The embodiments will be described in detail with reference to the following drawings in which like reference numerals refer to like elements wherein.

DETAILED DESCRIPTION

Figure 1:
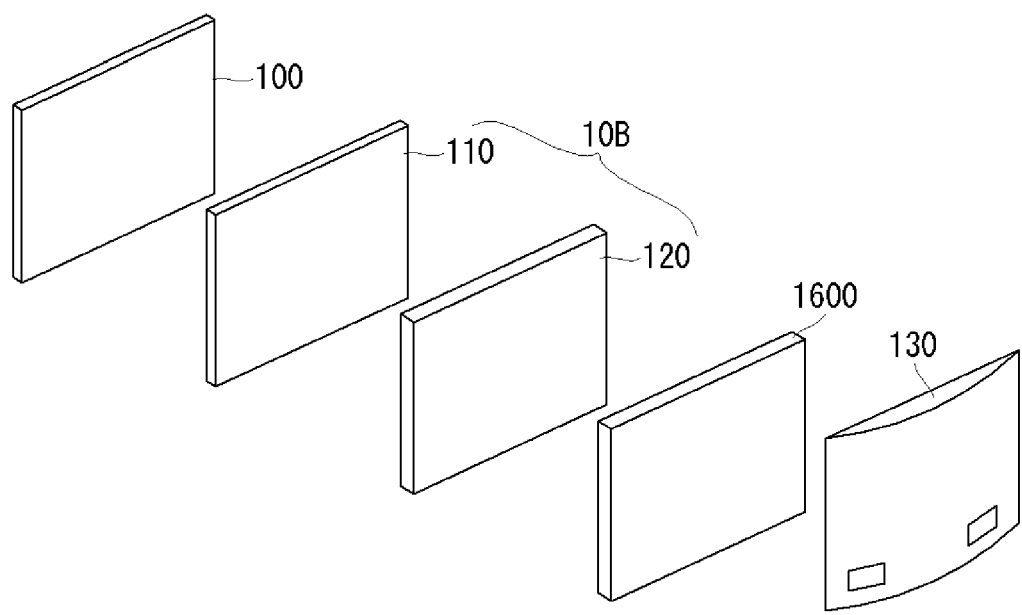
FIGS. 1 to 13 schematically illustrate configuration of a display device according to an exemplary embodiment of the disclosure.

Reference will now be made in detail embodiments of the disclosure examples of which are illustrated in the accompanying drawings. Since the present disclosure may be modified in various ways and may have various forms, specific embodiments are illustrated in the drawings and are described in detail in the present specification. However, it should be understood that the present disclosure is not limited to specific disclosed embodiments, but include all modifications, equivalents and substitutes included within the spirit and technical scope of the present disclosure.

The terms 'first', 'second', etc. may be used to describe various components, but the components are not limited by such terms. The terms are used only for the purpose of distinguishing one component from other components. For example, a first component may be designated as a second component without departing from the scope of the present disclosure. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present disclosure. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present disclosure pertains. The terms defined in a generally used dictionary must be understood to have meanings identical to those used in the context of a related art, and are not to be construed to have ideal or excessively formal meanings unless they are obviously specified in the present application.

The following exemplary embodiments of the present disclosure are provided to those skilled in the art in order to describe the present disclosure more completely. Accordingly, shapes and sizes of elements shown in the drawings may be exaggerated for clarity.

Hereinafter, a liquid crystal display panel is used as an example of a display panel. Other display panels may be used. For example, a plasma display panel (PDP), a field emission display (FED) panel, and an organic light emitting display panel may be used.

FIGS. 1 to 13 schematically illustrate configuration of a display device according to an exemplary embodiment of the disclosure.

As shown in FIG. 1, a display device according to an exemplary embodiment of the disclosure may include a display panel 100, a backlight unit 10B including an optical layer 110 and a light source part 120, a frame 1600, and a back cover 130. When the backlight unit 10B includes the optical layer 110 and the light source part 120, the display panel 100 may be a liquid crystal display panel.

In the embodiment of the disclosure, the display panel 100, the backlight unit 10B, and the frame 1600 may be referred to as a module.

The display panel 100 displaying an image may include a front substrate and a back substrate which are positioned opposite each other.

The optical layer 110 may be disposed between the back substrate of the display panel 100 and the back cover 130.

The optical layer 110 may include a plurality of sheets. For example, although not shown, the optical layer 110 may include at least one of a prism sheet and a diffusion sheet.

The light source part 120 may include various kinds of light sources in the embodiment of the disclosure. For example, the light sources of the light source part 120 may be one of a light emitting diode (LED) chip and a LED package having at least one LED chip. In this instance, the light source may be a colored LED emitting at least one of red, green, and blue light or a white LED.

The backlight unit 10B may be one of a direct type backlight unit and an edge type backlight unit.

The frame 1600 and the back cover 130 may be positioned in the rear of the backlight unit 10B.

The light source part 120 may be disposed on the frame 1600. For example, when the backlight unit 10B is the direct type backlight unit, the plurality of light sources included in the light source part 120 may be disposed on the frame 1600 in a predetermined pattern.

The back cover 130 may protect the backlight unit 10B from an impact and a pressure applied from the outside.

The display panel 100 may include the front substrate and the back substrate which are positioned opposite each other.

So far, the embodiment of the disclosure described that the display panel 100 is the liquid crystal display panel, but is not limited thereto.

More specifically, because the embodiment of the disclosure fixes the display device using an inner magnet part and an outer magnet part, it may be advantageous to reduce the weight of the display panel. Considering this, it may be preferable that the display panel of the display device according to the embodiment of the disclosure is an organic display panel.

When the display panel 100 is the organic display panel, the frame 1600 may be attached to a back surface of the display panel 100 using an adhesive sheet (not shown).

Figure 2:
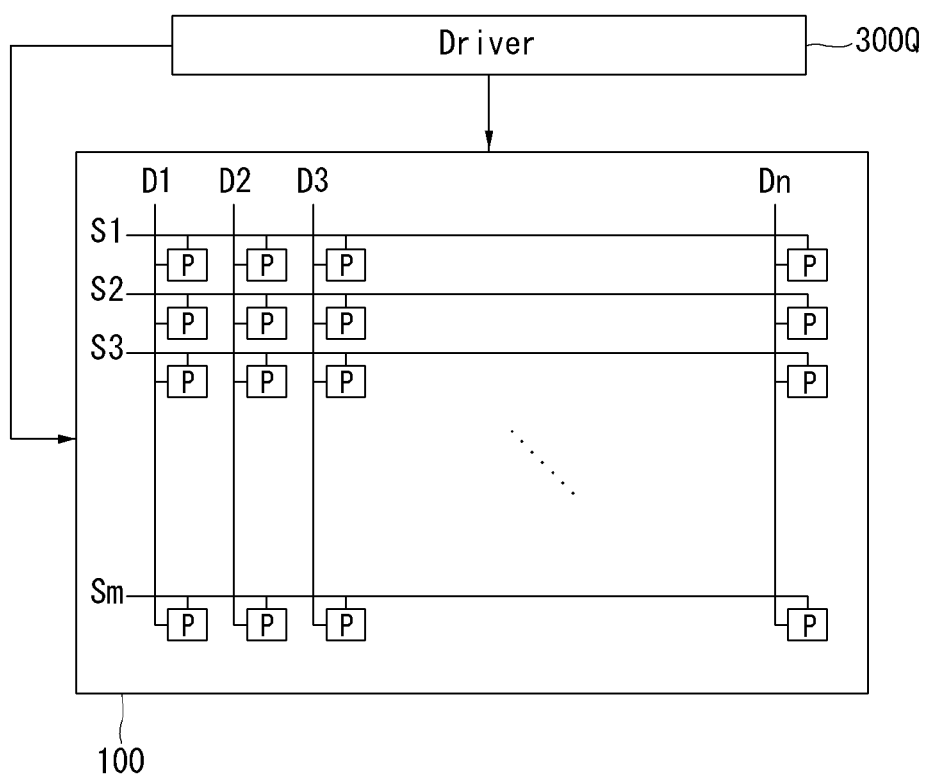

FIG. 2 shows an organic light emitting display panel.

An organic light emitting display panel 100 may display a predetermined image in response to a driving signal supplied by a driver 300Q.

FIG. 2 shows that the driver 300Q is configured as one module. However, the driver 300Q may be configured as at least two modules. For example, the driver 300Q may include a data driver (not shown) for generating and controlling a driving signal supplied to data lines and a scan driver (not shown) for generating and controlling a driving signal supplied to scan lines.

The driver 300Q may be referred to as a driving board.

The organic light emitting display panel 100 may include scan lines S1 to Sm and data lines D1 to Dn crossing the scan lines S1 to Sm. Subpixels P may be disposed at crossings of the scan lines S1 to Sm and the data lines D1 to Dn.

The scan lines S1 to Sm may supply a scan signal to the subpixels P. Preferably, the scan lines S1 to Sm may provide a supply path of the scan signal generated by the driver 300Q.

The data lines D1 to Dn may supply a data signal to the subpixels P. Preferably, the data lines D1 to Dn may provide a supply path of the data signal generated by the driver 300Q.

Although not shown in FIG. 2, erase lines, to which an erase signal is supplied, may be disposed on the organic light emitting display panel 100.

An exemplary structure of the subpixel is described below with reference to FIG. 3.

The subpixel may include an organic light emitting diode (OLED) cell. The subpixel may further include a first transistor Tr1, a second transistor Tr2, a third transistor Tr3, and a capacitor C.

When the scan signal is supplied to a scan line Scan, the first transistor Tr1 may be turned on. In this instance, when the data signal is supplied to a data line Data, a difference between a power voltage VDD and a voltage Vd of the data signal may be formed between both terminals of the capacitor C. Hence, a voltage (VDD-Vd) may be stored in the capacitor C.

The voltage (VDD-Vd) may be supplied to a gate terminal of the third transistor Tr3, and thus the third transistor Tr3 may be turned on. Hence, a current resulting from the voltage (VDD-Vd) stored in the capacitor C may be supplied to the OLED cell, and the OLED cell may emit light.

When the erase signal is supplied to an erase line Erase, the second transistor Tr2 may be turned on. Hence, both terminals of the capacitor C may be short-circuited. As a result, all of a voltage charged to the capacitor C may be discharged, and the third transistor Tr3 may be turned off. Further, the OLED cell may stop emitting light.

Figure 3:
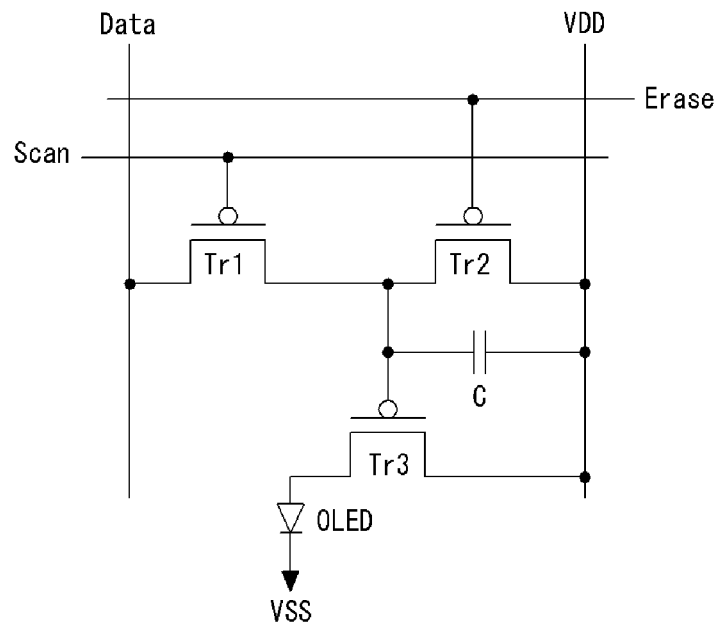

FIG. 3 illustrates an example of the organic light emitting display panel 100 applicable to the embodiment of the disclosure, and thus the embodiment of the disclosure is not limited thereto. For example, the erase line Erase may be omitted in the organic light emitting display panel 100.

Figure 4:
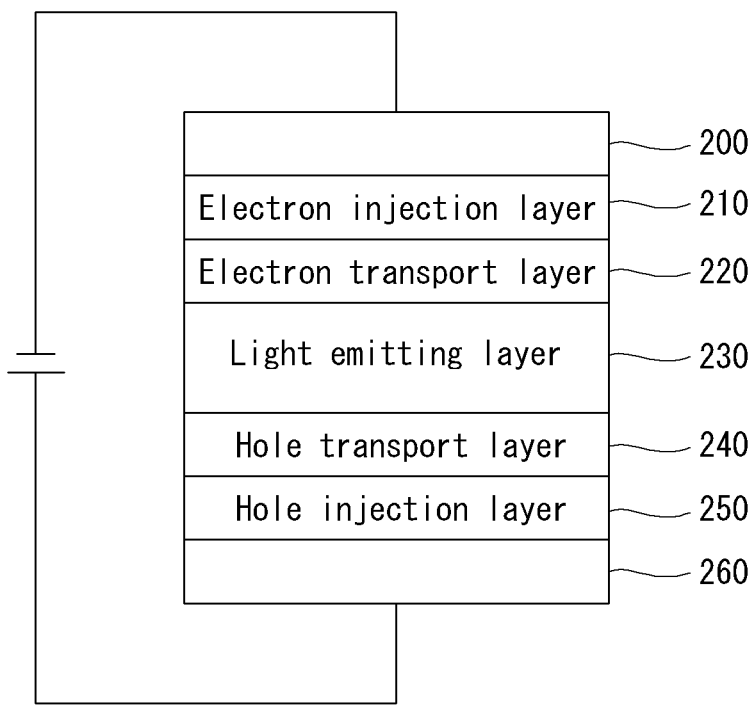

FIG. 4 illustrates a light emitting principle of the OLED cell.

As shown in FIG. 4, the OLED cell may include an electron injection layer 210, an electron transport layer 220, a light emitting layer 230, a hole transport layer 240, and a hole injection layer 250 between a cathode electrode 200 and an anode electrode 260 of the OLED cell.

When the voltage is supplied to the cathode electrode 200 and the anode electrode 260, a gray scale current flows in the OLED cell. Hence, electrons generated in the cathode electrode 200 move to the light emitting layer 230 through the electron injection layer 210 and the electron transport layer 220.

Further, holes generated in the anode electrode 260 move to the light emitting layer 230 through the hole injection layer 250 and the hole transport layer 240.

In this instance, the electrons supplied from the electron injection layer 210 and the electron transport layer 220 and the holes supplied from the hole injection layer 250 and the hole transport layer 240 collide with each other and are recombined with each other in the light emitting layer 230. Light is generated in the light emitting layer 230 due to the collision between the electrons and the holes.

A luminance of the light generated in the light emitting layer 230 may be proportional to a magnitude of the gray scale current supplied from the anode electrode 260.

FIG. 4 illustrates an example of the structure and the light emitting principle of the OLED cell, and thus the embodiment of the disclosure is not limited thereto. For example, at least one of the electron injection layer 210, the electron transport layer 220, the hole transport layer 240, and the hole injection layer 250 may be omitted in the OLED cell.

Hereinafter, the embodiment of the disclosure is described using the liquid crystal display panel as an example of the display panel 100. However, the embodiment of the disclosure may be applied to the organic light emitting display panel. If the organic light emitting display panel is used as the display panel 100 according to the embodiment of the disclosure, the optical layer 110 and/or the light source part 120 may be omitted.

Figure 5:
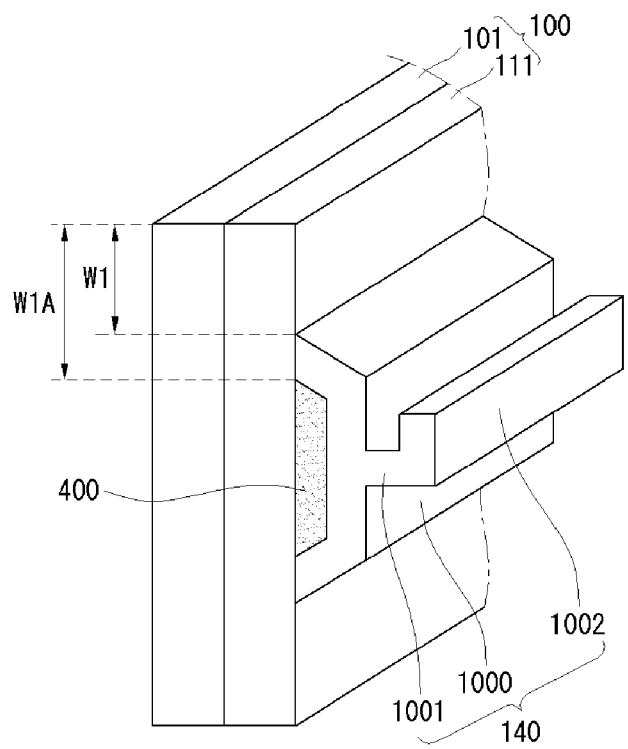

As shown in FIG. 5, a bracket 140 may be attached to a back surface of a back substrate 111 of the display panel 100. An adhesive layer 400 may be formed between the back surface of the back substrate 111 and the bracket 140, so as to attach the bracket 140 to the back substrate 111.

As described above, when the bracket 140 is attached to the back surface of the back substrate 111 using the adhesive layer 400, a supporter such as a pem nut and a boss and a fastening member such as a screw are not used to fasten the bracket 140 to the back substrate 111. Therefore, a fixing process may be simply performed, the manufacturing cost may be reduced, and a thickness of the display device may be reduced.

A groove may be formed in one surface of the bracket 140 opposite the back substrate 111, so as to improve an adhesive strength between the bracket 140 and the back substrate 111. The adhesive layer 400 may be formed in the groove.

In this instance, because the groove 141 may prevent an adhesive material of the adhesive layer 400 from being discharged to the outside of the bracket 140, an attaching process may be easily performed.

As described above, when the bracket 140 is attached to the back surface of the back substrate 111, the display panel 100 may include a portion W1A extending further than the adhesive layer 400 in a longitudinal direction of the display panel 100. Further, the display panel 100 may include a portion W1 extending further than the bracket 140 in the longitudinal direction of the display panel 100.

The shape of the bracket 140 may be variously changed.

Figure 6:
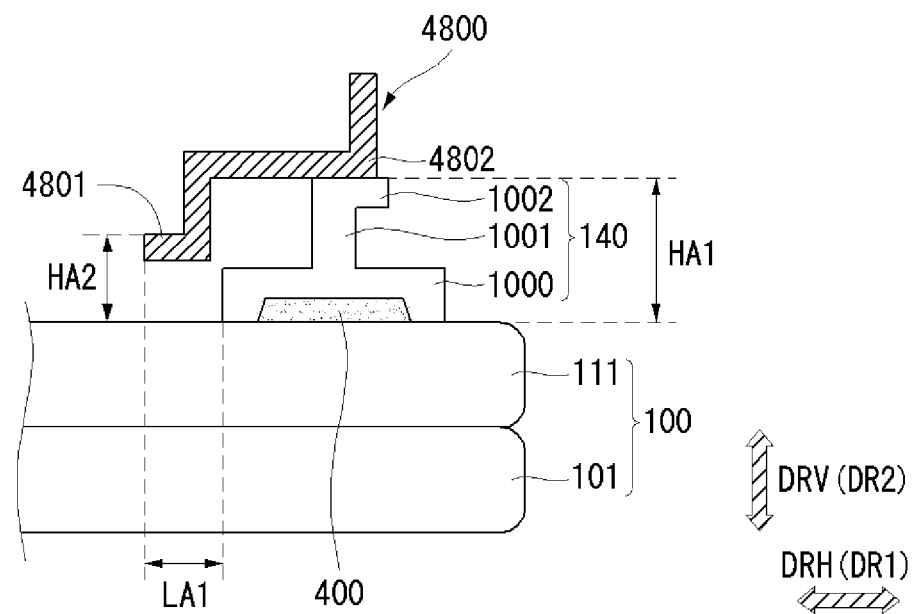

For example, as shown in FIG. 6, the bracket 140 may include a base 1000, a head 1002, and a pillar 1001 for connecting the base 1000 to the head 1002. The adhesive layer 400 may be disposed between the base 1000 of the bracket 140 and the back substrate 111.

In other words, the bracket 140 may include a depression (or groove) and may include a first surface to which the adhesive layer 400 is applied. The bracket 140 may include a first protrusion 1001 extending from a second surface opposite the first surface and a second protrusion 1002 extending from the first protrusion 1001. The first protrusion 1001 of the bracket 140 may extend in a direction far from the back substrate 111 in a vertical direction DRV (for example, a width direction or a second direction) of the back substrate 111. The second protrusion 1002 of the bracket 140 may extend from an end of the first protrusion 1001 in a horizontal direction DRH (for example, a longitudinal direction or a first direction) of the back substrate 111 such that the first and second protrusions 1001 and 1002 may have an inverted L-shape.

Hereinafter, the embodiment of the disclosure is described on the assumption that the bracket 140 includes the base 1000, the head 1002, and the pillar 1001. Other structures of the bracket 140 may be used.

As shown in FIG. 6, an auxiliary bracket 4800 may be disposed on the bracket 140. More specifically, the auxiliary bracket 4800 may be disposed on the head 1002 of the bracket 140. In the embodiment disclosed herein, the bracket 140 may be referred to as a first bracket, and the auxiliary bracket 4800 may be referred to as a second bracket or a sheet supporter.

Further, the auxiliary bracket 4800 may include a portion 4801 positioned close to the back substrate 111. Hereinafter, the portion 4801 of the auxiliary bracket 4800 positioned close to the back substrate 111 may be referred to as a low altitude part 4801.

More specifically, when a height of the bracket 140 is measured from the back surface of the back substrate 111, a height HA2 of the low altitude part 4801 of the auxiliary bracket 4800 may be less than a maximum height HA1 of the bracket 140.

The low altitude part 4801 of the auxiliary bracket 4800 may extend further than the bracket 140 toward the middle direction of the display panel 100 by a predetermined distance LA1.

In other words, at least one auxiliary bracket 4800 may include a first ledge 4802 and a second ledge 4801 extending in the horizontal direction DRH. The first and second ledges 4802 and 4801 may be separated from each other by an extension (not shown) extending in the vertical direction DRV. The extension may be connected to ends of the first and second ledges 4802 and 4801.

In this instance, the first ledge 4802 may be provided between the second protrusion 1002 of the bracket 140 and the frame (not shown) and may contact the frame. The configuration is described in detail below.

Figure 7:
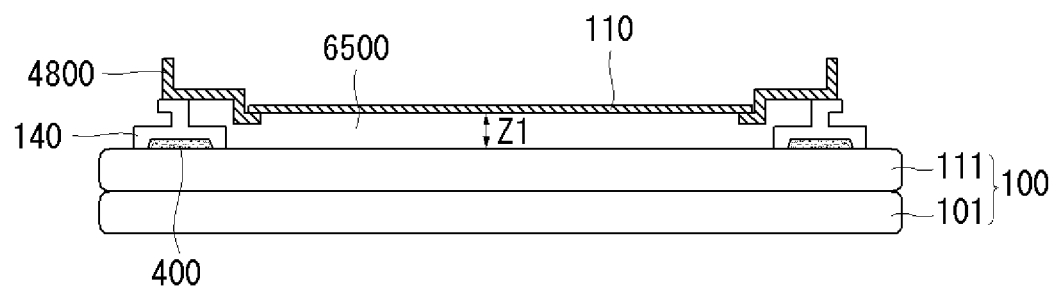

As shown in FIG. 7, the optical layer 110 between the display panel 100 and the back cover (not shown) may be disposed on the auxiliary bracket 4800. For example, the optical layer 110 may be disposed on the low altitude part 4801 of the auxiliary bracket 4800.

The optical layer 110 may not be fixed to the auxiliary bracket 4800 and may be placed on the low altitude part 4801 of the auxiliary bracket 4800. In this instance, the optical layer 110 is movable on the auxiliary bracket 4800.

As described above, when the optical layer 110 is disposed on the auxiliary bracket 4800, the optical layer 110 may be separated from the back substrate 111 of the display panel 100 by a predetermined distance Z1. Hence, an air gap 6500 may be formed between the back substrate 111 and the optical layer 110.

As described above, when the air gap 6500 is formed between the back substrate 111 and the optical layer 110, the optical characteristics of the display device may be improved by the air gap 6500.

In the display device according to the embodiment of the disclosure, the structure and the shape of the auxiliary bracket 4800 may be variously changed.

Figure 8:
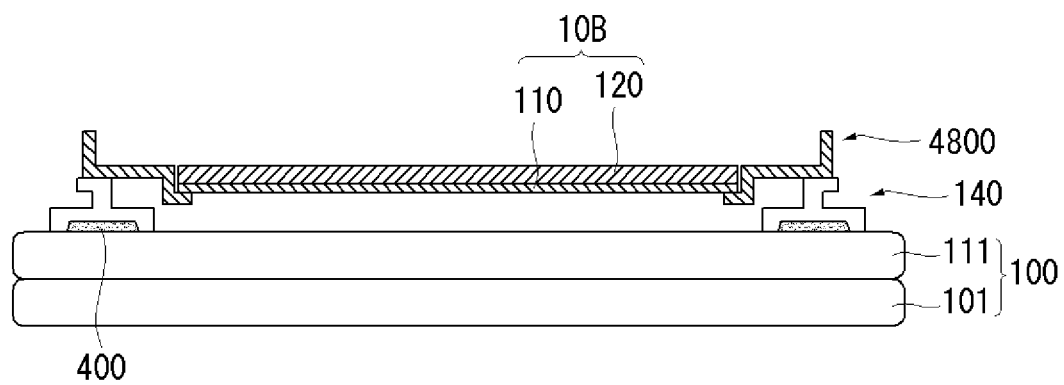

As shown in FIG. 8, the light source part 120 may be disposed on the optical layer 110. The light source part 120 may be disposed on the low altitude part 4801 of the auxiliary bracket 4800 along with the optical layer 110.

In this instance, the backlight unit 10B has a direct type light source part 120.

Figure 9:
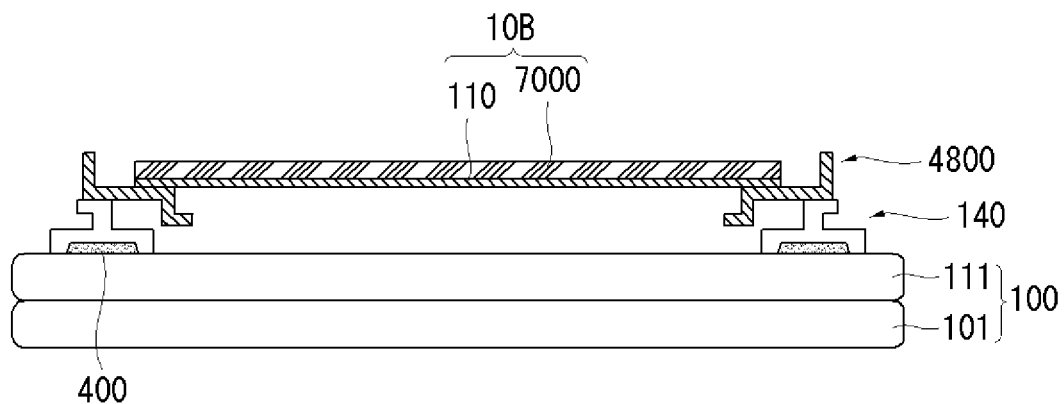

Alternatively, as shown in FIG. 9, the optical layer 110 may be disposed on the first ledge 4802 of the auxiliary bracket 4800.

FIG. 9 shows that a light guide plate 7000 is disposed on the optical layer 110. In this instance, the backlight unit 10B may be the edge type backlight unit and may include an edge type light source part.

Figure 10:
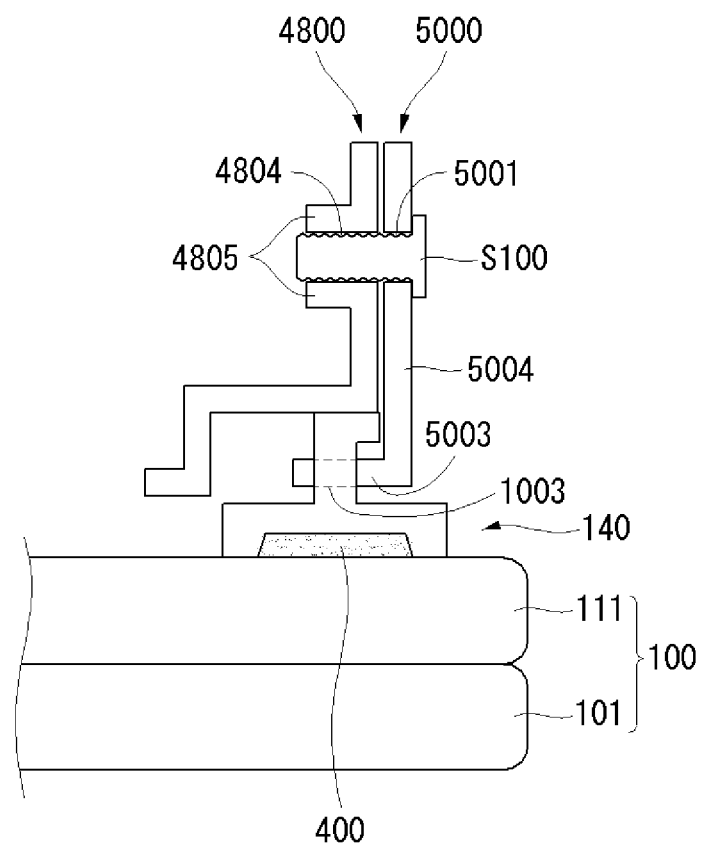

As shown in FIG. 10, a hole 1003 may be formed in the bracket 140.

A connection frame 5000 may be connected to the bracket 140 through the hole 1003.

The connection frame 5000 may not be fixed to the bracket 140, and a portion of the connection frame 5000 may be simply inserted into the hole 1003 of the bracket 140.

Hence, an external pressure, for example, a twist transferred to the connection frame 5000 may be prevented from being transferred to the display panel 100 through the bracket 140, and a light leakage phenomenon may be further prevented.

In this instance, the auxiliary bracket 4800 may be provided adjacent to the plurality of brackets 140 and may be connected to the at least one connection frame 5000.

In other words, the connection frame 5000 may include a side wall 5004 and a plurality of first tab portions 5003 extending in the horizontal direction DRH. The first tab portion 5003 may pass through the hole 1003 of the first protrusion of the bracket 140.

In this instance, a width of the first tab portion 5003 in the horizontal direction DRH may be greater than a width of the second protrusion 1002 of the bracket 140.

A hole 5001 may be formed in the connection frame 5000, and a hole 4804 corresponding to the hole 5001 of the connection frame 5000 may be formed in the auxiliary bracket 4800. A fastening member S100 such as a screw may connect the connection frame 5000 to the auxiliary bracket 4800 through the hole 5001 of the connection frame 5000 and the hole 4804 of the auxiliary bracket 4800. In other words, the connection frame 5000 may include the first tab portion 5003 inserted into a hole (or a groove) 1003 of the bracket 140 and the side wall 5004 fastened to the auxiliary bracket 4800.

The first tab portion 5003 of the connection frame 5000 may be a horizontal portion, and the side wall 5004 of the connection frame 5000 may be a vertical portion.

Figure 11:
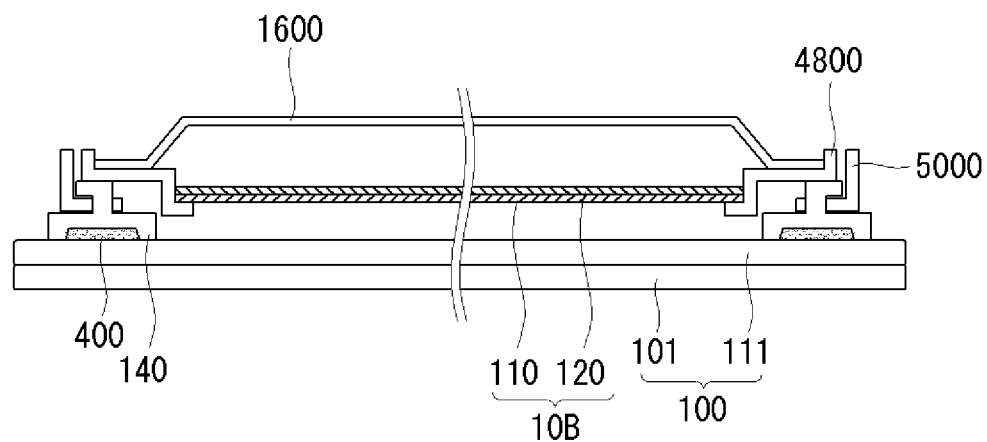

As shown in FIG. 11, the frame 1600 may be positioned on the auxiliary bracket 4800.

Figure 12:
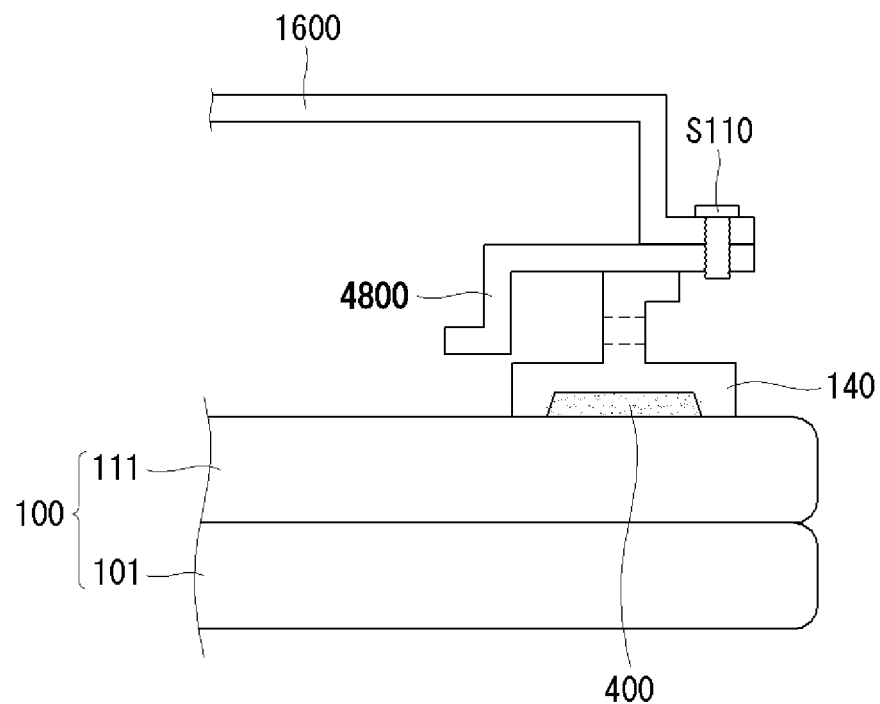

As shown in FIG. 12, the auxiliary bracket 4800 and the frame 1600 may be fastened to each other using a predetermined fastening member S110.

Figure 13:
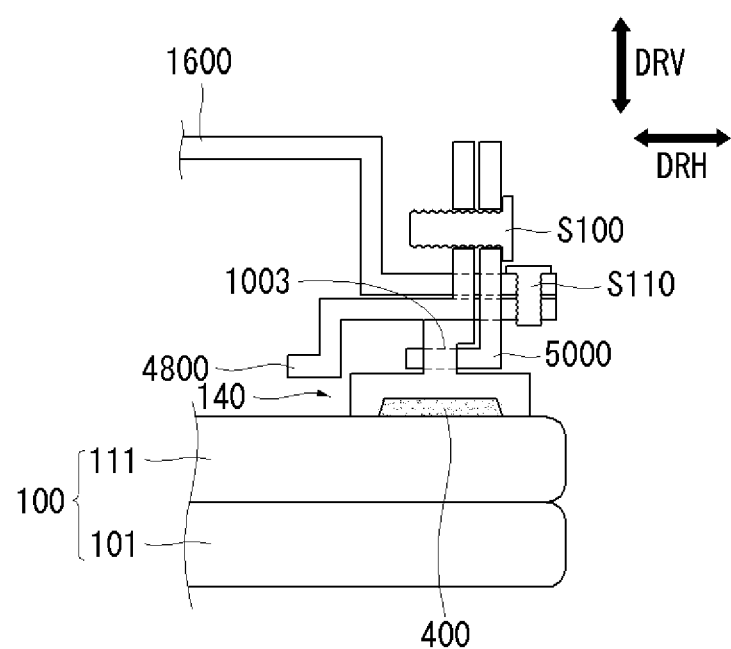

As shown in FIG. 13, the predetermined fastening member S110 may fasten the auxiliary bracket 4800 to the frame 1600 in a predetermined area, and the predetermined fastening member S100 may fasten the auxiliary bracket 4800 to the connection frame 5000 in another area.

FIGS. 14 to 42 illustrate in detail configuration of the display device according to the embodiment of the disclosure. In the following description, the descriptions of the configuration and the structure described above are omitted.

Figure 14:
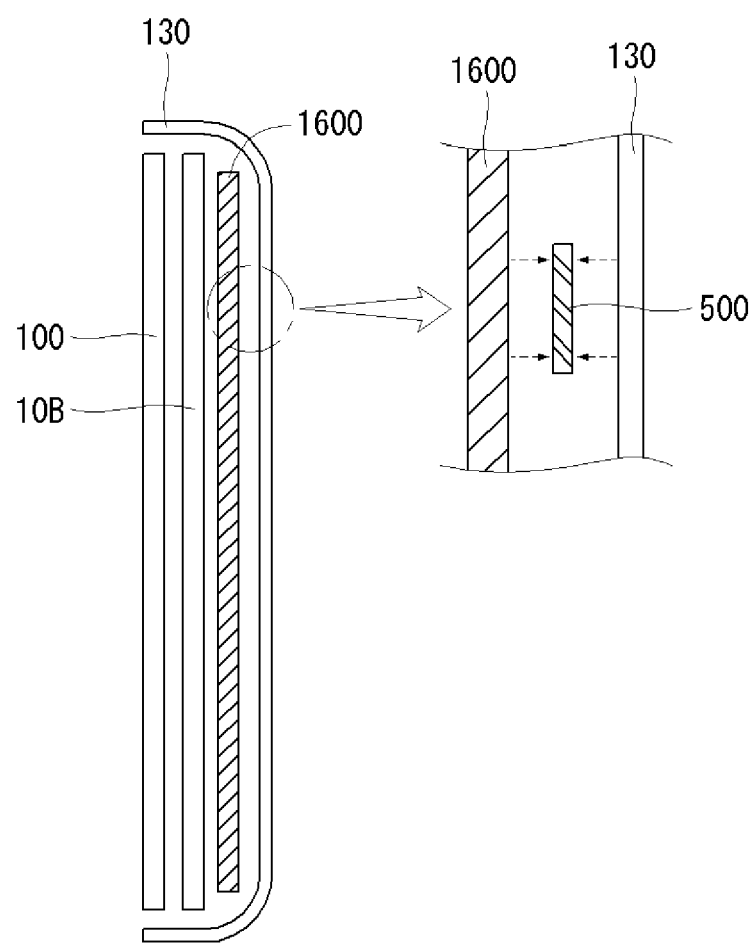
FIGS. 14 to 42 illustrate in detail configuration of a display device according to an exemplary embodiment of the disclosure.

As shown in FIG. 14, the display device may include an inner magnet part 500 disposed between the back cover 130 and the frame 1600.

The inner magnet part 500 may magnetically couple the back cover 130 with the frame 1600. In this instance, the back cover 130 and the frame 1600 may be formed of an iron material.

Hence, the back cover 130 and the frame 1600 may be connected to each other without using the fastening member such as the screw. Alternatively, the back cover 130 and the frame 1600 may be sufficiently strongly connected to each other even if the number or the size of other fastening members is reduced.

Figure 15:
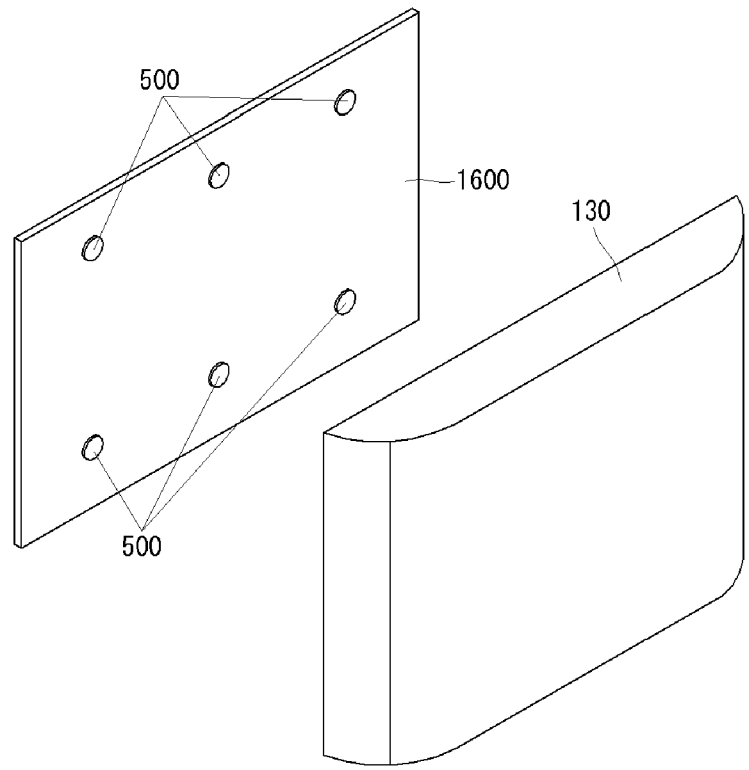

As shown in FIG. 15, the plurality of inner magnet parts 500 may be applied to one frame 1600.

In this instance, a coupling strength between the back cover 130 and the frame 1600 may be improved.

The inner magnet parts 500 may be coupled to the frame 1600.

Figure 16:
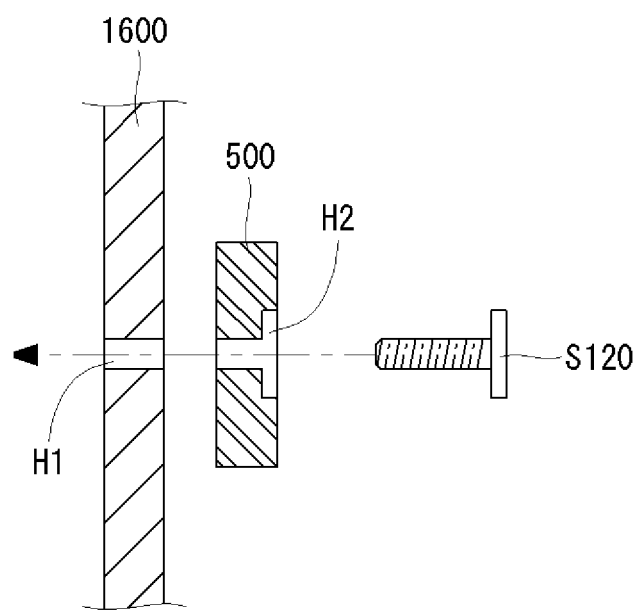

For this, as shown in FIG. 16, the inner magnet part 500 may include a hole H2, and the frame 1600 may include a groove or a hole H1 corresponding to the hole H2 of the inner magnet part 500.

A predetermined fastening member S120 may be inserted into the hole H2 of the inner magnet part 500 and the groove or the hole H1 of the frame 1600, thereby connecting the inner magnet part 500 to the frame 1600.

Alternatively, the inner magnet part 500 may be fastened to the back cover 130.

Alternatively, the inner magnet part 500 may be magnetically attached to the frame 1600. In this instance, the frame 1600 may be formed of an iron material, so that the inner magnet part 500 is magnetically attached to the frame 1600.

Alternatively, the inner magnet part 500 may be connected to the frame 1600 through a welding method, etc.

As described above, when the inner magnet part 500 is magnetically attached to the frame 1600 and/or the inner magnet part 500 is welded to the frame 1600, the fastening member such as the screw may not be used.

Figure 17:
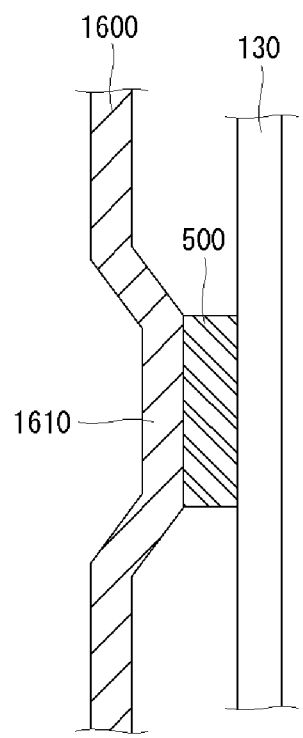

As shown in FIG. 17, the frame 1600 may include a protrusion 1610 protruding toward the back cover 130.

The inner magnet part 500 may be disposed in the protrusion 1610 of the frame 1600.

In this instance, the back cover 130 may be magnetically and more efficiently connected to the frame 1600. Further, when the inner magnet part 500 is relatively thin, the back cover 130 may be magnetically and more efficiently connected to the frame 1600.

Figure 18:
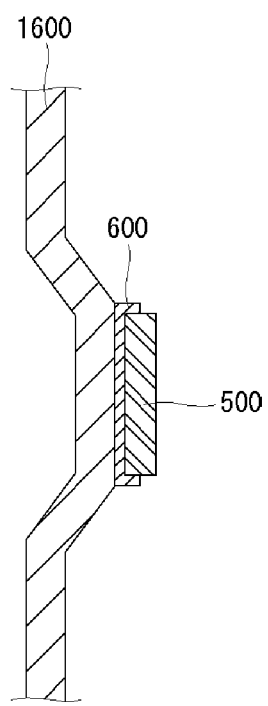

As shown in FIG. 18, a first detachment prevention unit 600 may be disposed on the frame 1600 so as to prevent the detachment of the inner magnet part 500. The first detachment prevention unit 600 may prevent the detachment of the inner magnet part 500.

The inner magnet part 500 may be inserted into the first detachment prevention unit 600 in a state where the first detachment prevention unit 600 is welded to the frame 1600 in a manufacturing process.

Alternatively, a structure for preventing the detachment of the inner magnet part 500 may be disposed on the back cover 130.

Figure 19:
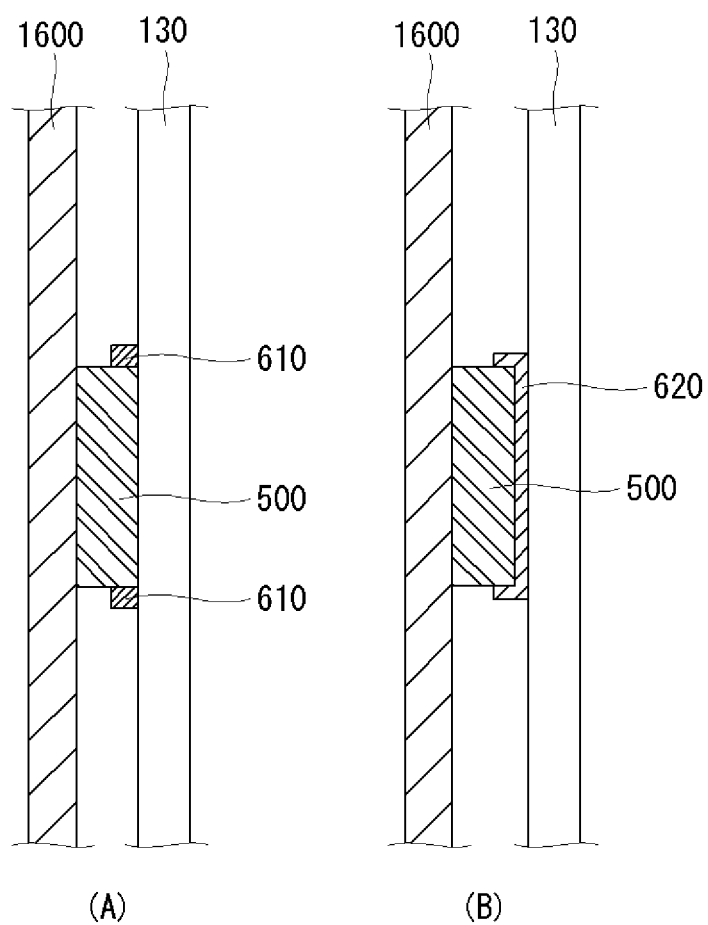

As shown in (A) of FIG. 19, the back cover 130 may be disposed around the inner magnet part 500 and may include protrusions 610 protruding toward the frame 1600.

Figure 20:
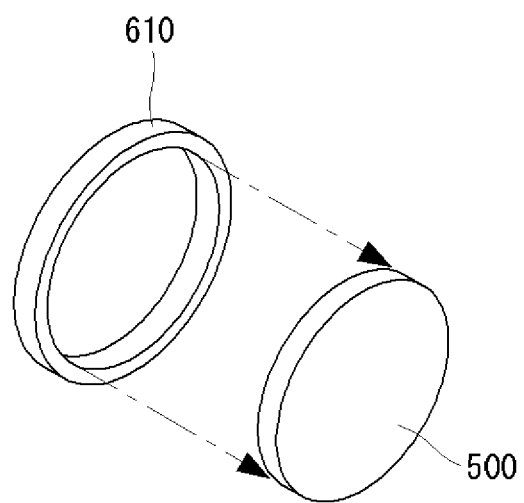
Figure 21:
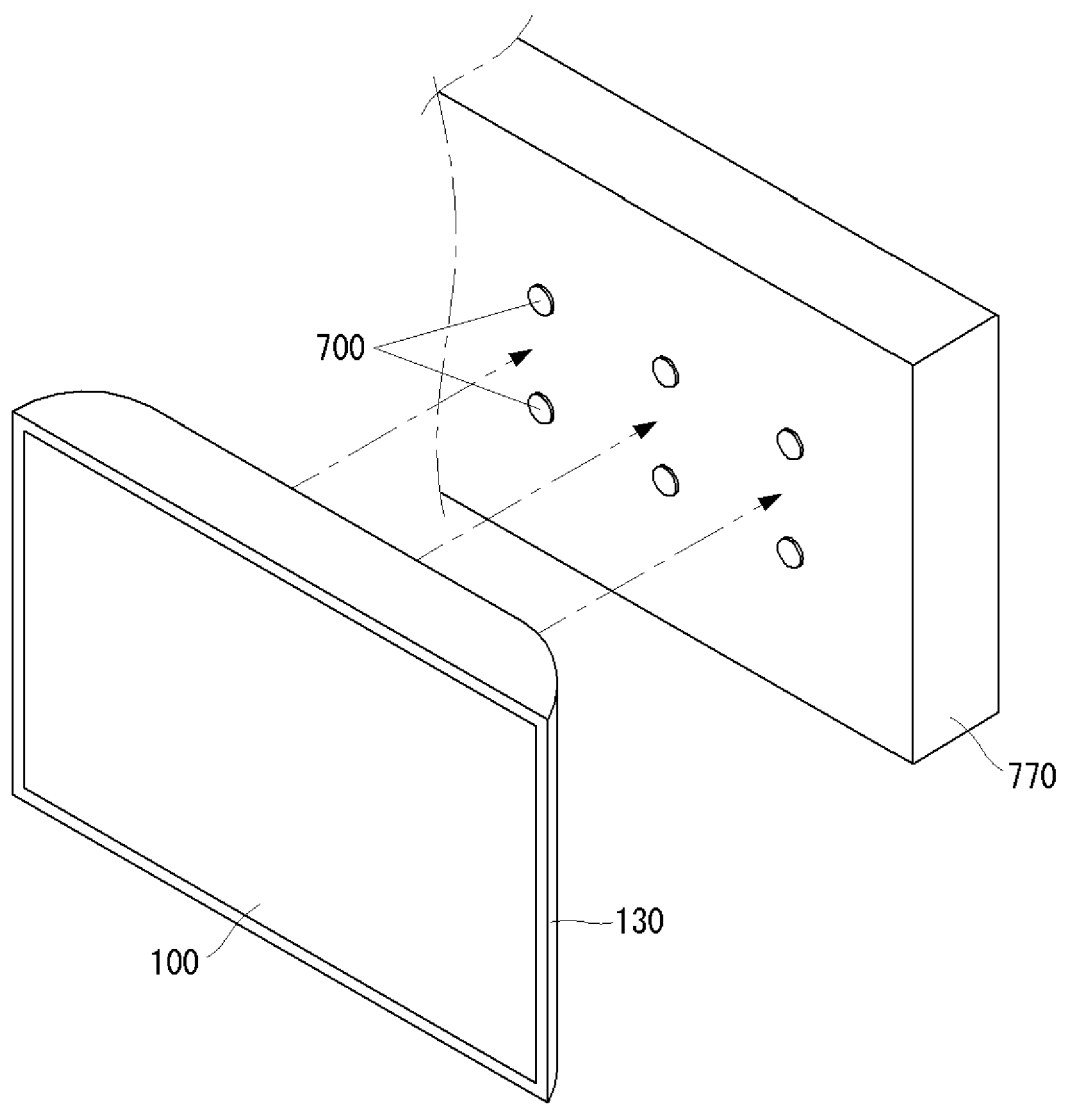

As shown in FIG. 20, the protrusions 610 may have a ring shape. The protrusions 610 may surround the inner magnet part 500, and thus the inner magnet part 500 may be firmly fixed to the back cover 130.

As shown in (B) of FIG. 19, a second detachment prevention unit 620 may be disposed on the back cover 130.

The second detachment prevention unit 620 may be connected to the back cover 130 through the welding process. Alternatively, the second detachment prevention unit 620 may be attached to the back cover 130 by an adhesive layer.

The display device according to the embodiment of the disclosure may further include an outer magnet part 700 which is disposed in the rear of the back cover 130 and corresponds to the inner magnet part 500.

The outer magnet part 700 may be installed on a predetermined structure, such as a wall 770 and a holder, for holding the display device.

Figure 22:
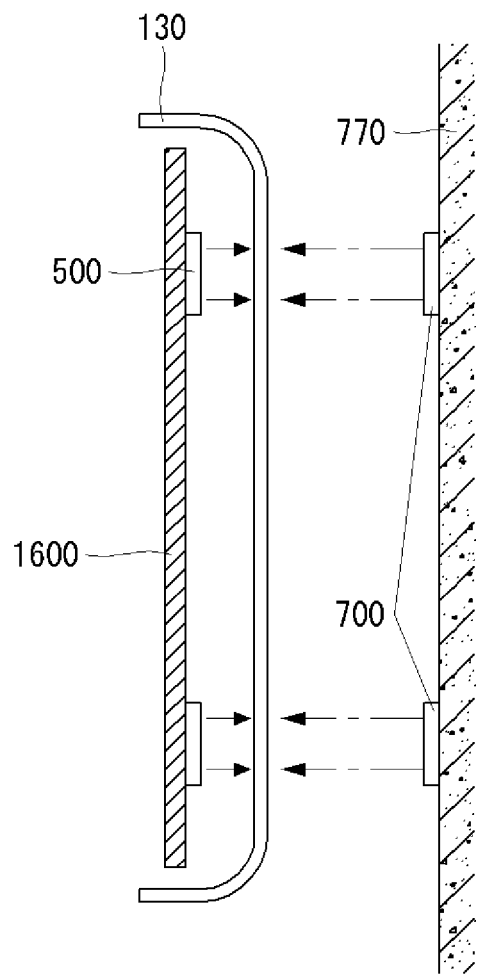

As shown in FIG. 22, the inner magnet part 500 and the outer magnet part 700 may be magnetically coupled with each other with the back cover 130 interposed therebetween.

In this instance, the display device may be easily held on the structure, such as the wall 770 and the holder, without using a component such as a wall holder.

Figure 23:
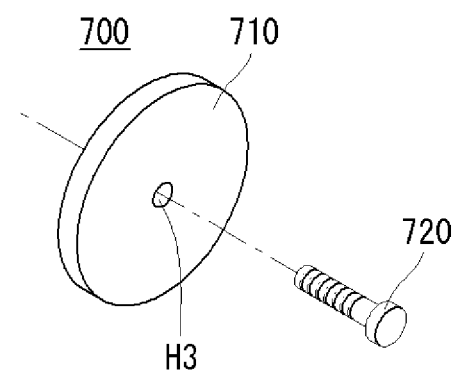

As shown in FIG. 23, the outer magnet part 700 may include a base magnet 710 having magnetism and a hole H3 formed in the base magnet 710.

In such a configuration, a predetermined fastening member 720 may pass through the hole H3 and thus may be connected to the structure, such as the wall 770 and the holder. Hence, the outer magnet part 700 may be fixed to the structure, such as the wall 770 and the holder.

Figure 24:
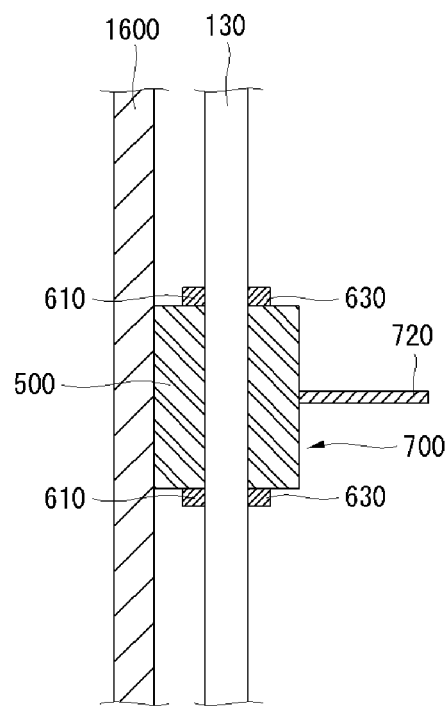

As shown in FIG. 24, the back cover 130 may include other protrusions 630 which are positioned around the outer magnet part 700 and protrude in the opposite direction to a direction toward the frame 1600, so as to prevent the detachment of the outer magnet part 700.

The protrusions 630 of the back cover 130 may have a ring shape in the same manner as the protrusions 610 shown in FIG. 20.

The protrusions 630 may be connected to the back cover 130 through the welding method, etc., or may be attached to the back cover 130 using an adhesive, an adhesive sheet, etc.

Figure 25:
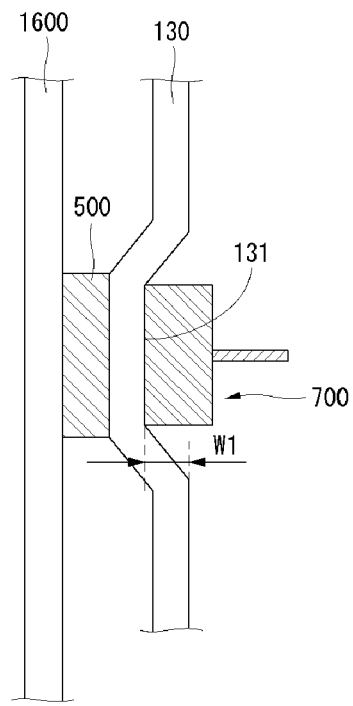

As shown in FIG. 25, the back cover 130 may include a first depression 131, which is depressed toward the inner magnet part 500 and into which the outer magnet part 700 is inserted. In this instance, the first depression 131 may efficiently prevent the detachment of the outer magnet part 700.

As described above, when the back cover 130 includes the first depression 131 into which the outer magnet part 700 is inserted, a distance between the display device and the structure, such as the wall 770 and the holder, may be reduced by a depth W1 of the first depression 131 when the display device is held.

Figure 26:
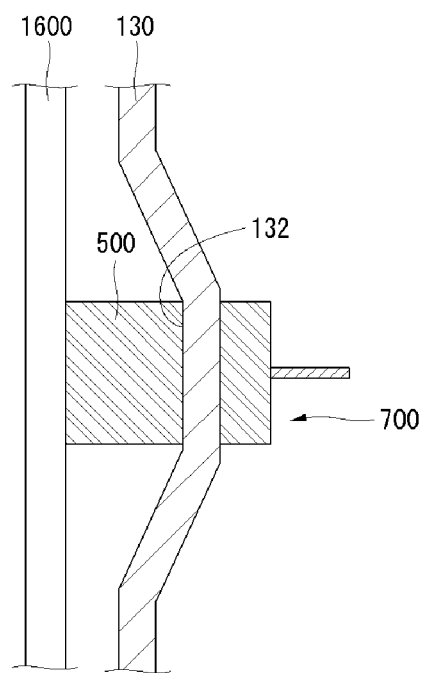

As shown in FIG. 26, the back cover 130 may include a second depression 132, which is depressed toward the outer magnet part 700 and into which the inner magnet part 500 is inserted. In this instance, the second depression 132 may efficiently prevent the detachment of the inner magnet part 500. Further, it may be easy to confirm a contact point between the inner magnet part 500 and the outer magnet part 700 in a process for holding the display device.

Figure 27:
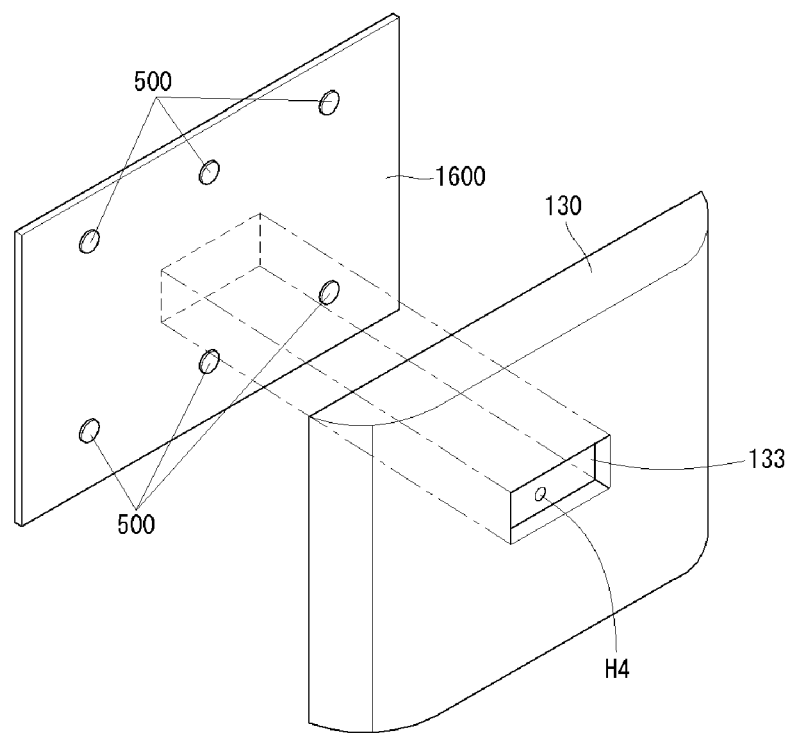
Figure 28:
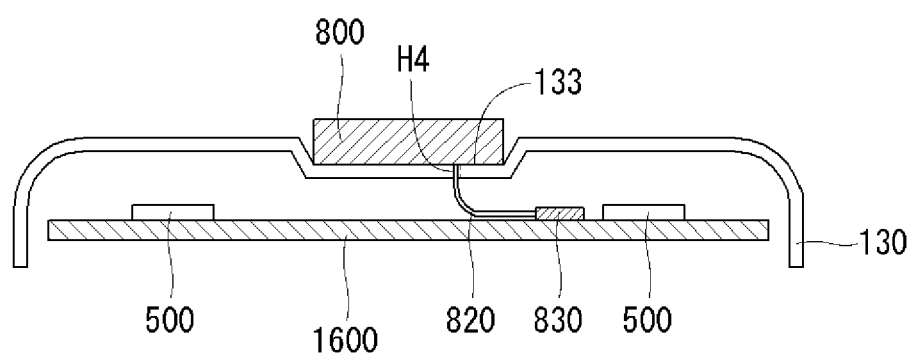

As shown in FIGS. 27 and 28, the back cover 130 may include a third depression 133, which is depressed toward the frame 1600. The third depression 133 may be positioned in an area between the plurality of inner magnet parts 500. Namely, the plurality of inner magnet parts 500 may be disposed around the third depression 133.

A speaker 800 may be disposed in the third depression 133. For example, a Woofer Speaker having a relatively large volume may be disposed in the third depression 133.

As described above, when the speaker 800 is disposed in the third depression 133 of the back cover 130, it is possible to sufficiently increase the size of the speaker 800. Further, because the speaker 800 is mounted in the third depression 133 of the back cover 130, it is possible to freely change the shape of the speaker 800 as well as an increase in the size of the speaker 800.

The speaker 800 disposed in the third depression 133 of the back cover 130 may be exposed to the outside.

Further, a hole H4 may be formed in the third depression 133 of the back cover 130.

The speaker 800 may be connected with a driving board 830 through the hole H4. For example, a cable 820 for connecting the speaker 800 with the driving board 830 may pass through the hole H4.

The driving board 830 may supply a driving signal for driving the speaker 800 to the speaker 800.

Figure 29:
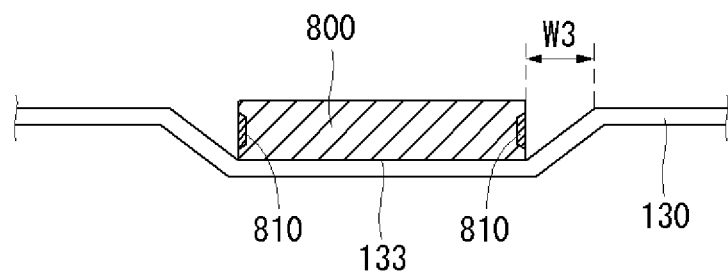

As shown in FIG. 29, an output unit 810 of the speaker 800 may be positioned on the side of the speaker 800 in a state where the speaker 800 is mounted in the third depression 133 of the back cover 130.

The output unit 810 of the speaker 800 may be a unit for outputting a sound of the speaker 800.

Figure 30:
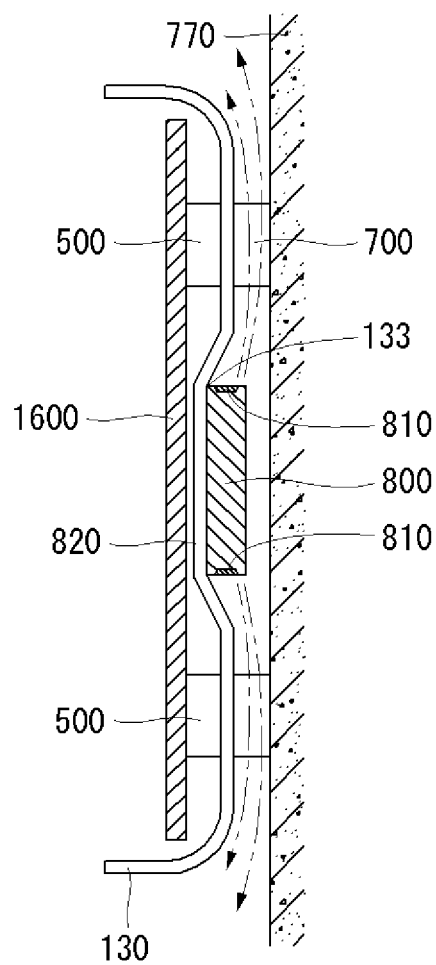

In this instance, as shown in FIG. 30, the sound output from the speaker 800 may efficiently pass through a space between the speaker 800 and the structure, such as the wall 770 and the holder, and may be emitted to the outside. In FIG. 30, arrows indicate a direction in which the sound is emitted.

A sufficient distance W3 may be provided between the output unit 810 of the speaker 800 and the back cover 130, so as to efficiently emit the sound output from the speaker 800 to the outside.

Figure 31:
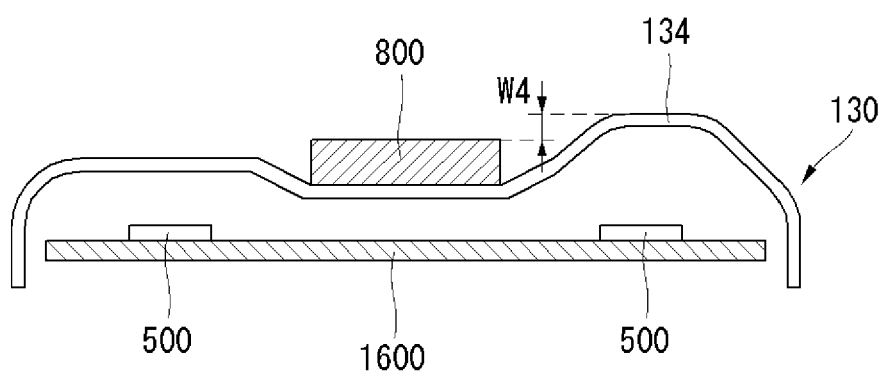

As shown in FIG. 31, when the speaker 800 is mounted in the third depression 133 of the back cover 130, the back cover 130 may include a protrusion 134 protruding to the rear so as to protect the speaker 800.

The protrusion 134 may protrude further than the speaker 800 by a predetermined height W4 in a state where the speaker 800 is mounted in the third depression 133 of the back cover 130.

In this instance, even if the display device collides with the wall 770, a damage of the speaker 800 may be prevented.

Figure 32:
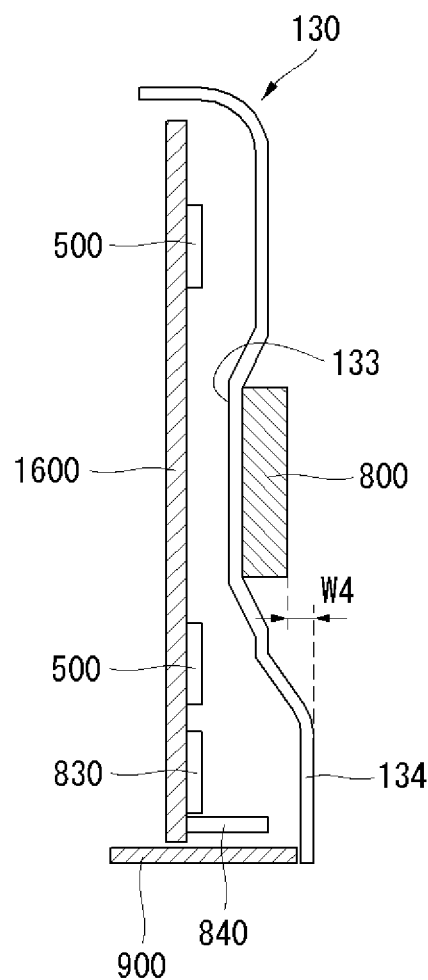

As shown in FIG. 32, the protrusion 134 of the back cover 130 may overlap a formation area of the driving board 830.

In this instance, when the back cover 130 includes the protrusion 134, a sufficient space for the driving board 830 may be provided between the frame 1600 and the back cover 130. In addition, an effect capable of protecting the speaker 800 may be obtained.

In FIG. 32, reference numeral '840' denotes a predetermined circuit element, and reference numeral '900' denotes a bottom cover. The bottom cover 900 is described later.

Figure 33:
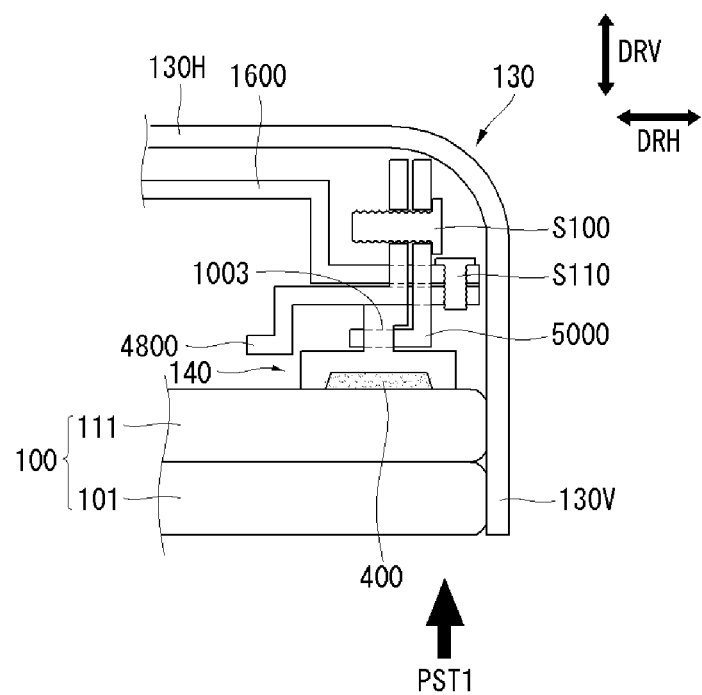

As shown in FIG. 33, the back cover 130 may include a horizontal part 130H extending in the first direction DRH and a vertical part 130V extending in the second direction DRV crossing the first direction DRH. Simply for ease of discussion, the first direction DRH may be referred to as the horizontal direction and the second direction DRV may be referred to as the vertical direction, relative to the directions in FIG. 33.

The vertical part 130V of the back cover 130 may cover the side of the display panel 100. The vertical part 130V may be side surfaces of the back cover 130 and may extend toward the front of the display. The back cover 130 may also include top surfaces that extend toward the front of the display to cover the top edge of the display.

The horizontal part 130H of the back cover 130 may include a portion positioned in the rear of the frame 1600. The horizontal part 130H may be referred to as the rear surface of the back cover 130.

An edge of the front surface of the display panel 100 may be exposed in a state where the back cover 130 is mounted. More specifically, when a user at a first position PST1 watches the display panel 100, the user may observe the edge of the front surface of the display panel 100. In this instance, visibility may be improved.

When the inner magnet part 500 is disposed between the back cover 130 and the frame 1600 to magnetically connect the back cover 130 with the frame 1600, it may be easy to apply the back cover 130 including a portion positioned in the rear and the side of the display panel 100 to the display device according to the embodiment of the disclosure.

Figure 34:
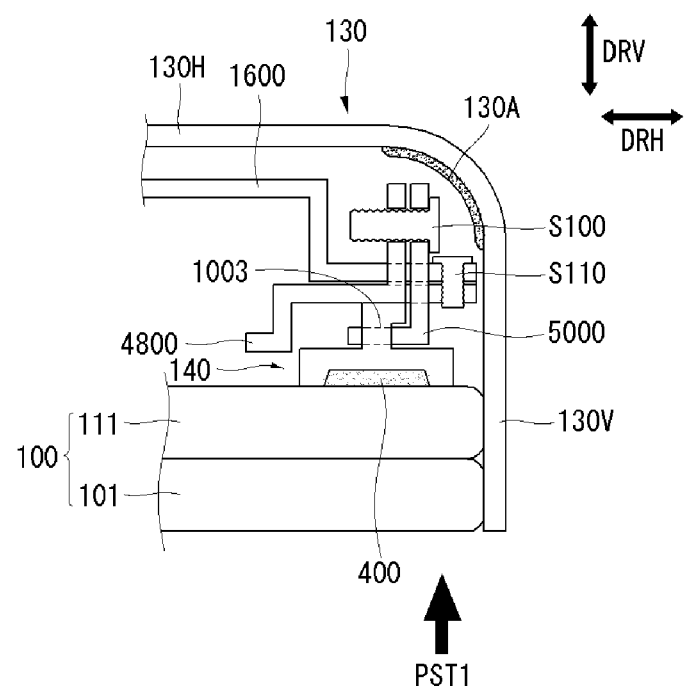

As shown in FIG. 34, a buffer 130A having elasticity may be disposed on an inner surface of the vertical part 130V of the back cover 130.

The buffer 130A may prevent a foreign material, such as a dust, from entering into the back cover 130 and a structure (for example, a space between the display panel 100 and the frame 1600) positioned inside the back cover 130. For example, the buffer 130A may be formed of a sponge material.

The buffer 130A may have a dark color, for example, a black.

Figure 35:
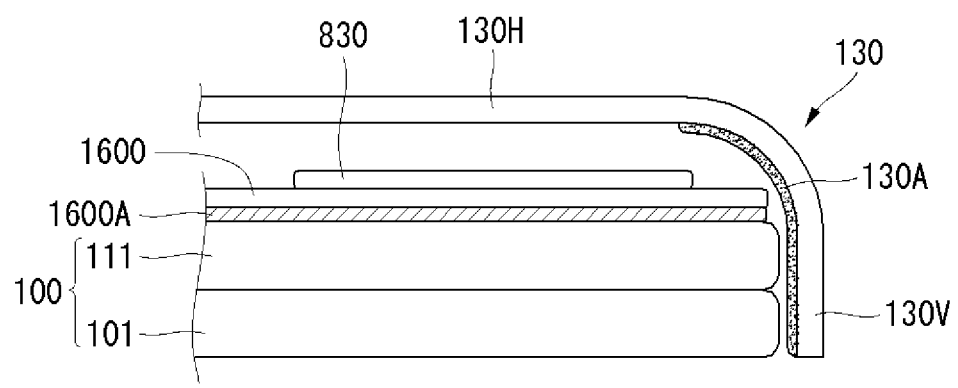

As shown in FIG. 35, when the display panel 100 is the organic display panel, the frame 1600 may be attached to the back surface of the display panel 100. In this instance, an adhesive layer 1600A may be disposed between the frame 1600 and the display panel 100.

Even in this instance, the vertical part 130V of the back cover 130 may cover the side of the display panel 100.

Figure 36:
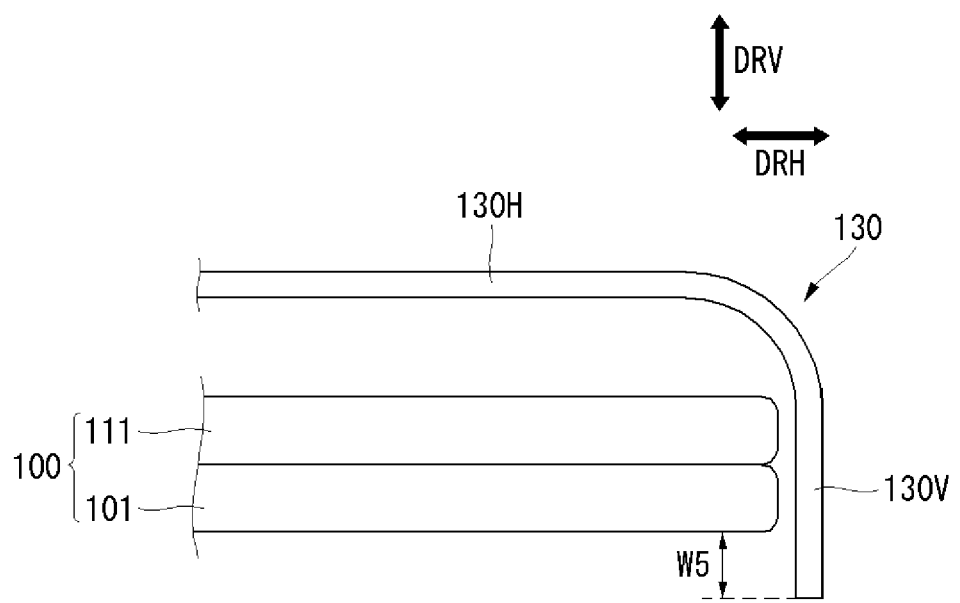

As shown in FIG. 36, the vertical part 130V of the back cover 130 may include a portion protruding further than the display panel 100 by a predetermined height W5 in the second direction DRV.

In this instance, the back cover 130 may prevent the side of the display panel 100 from being damaged.

Figure 37:
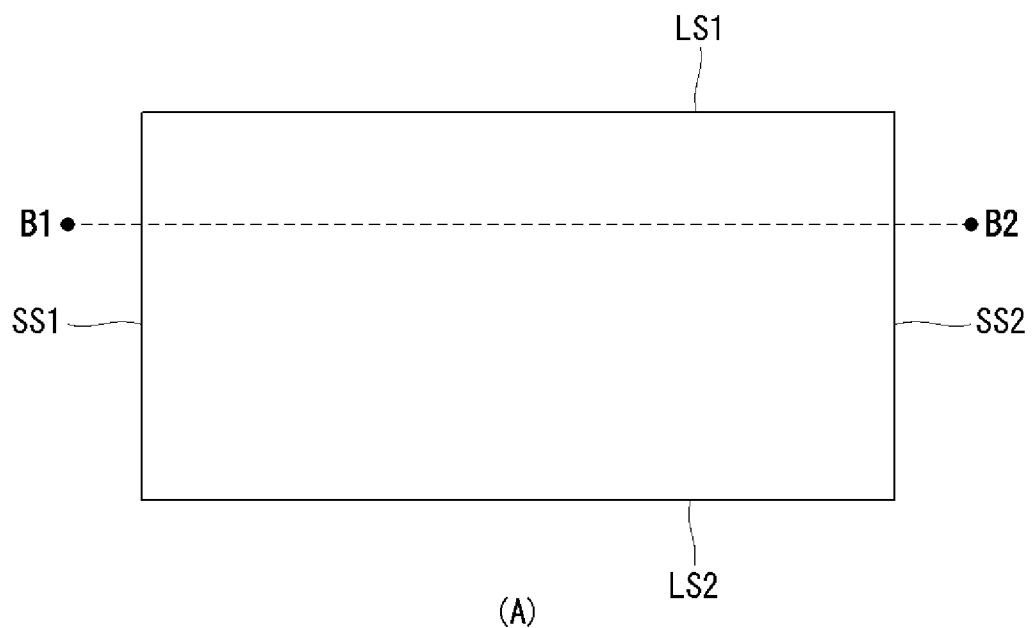
Figure 37:
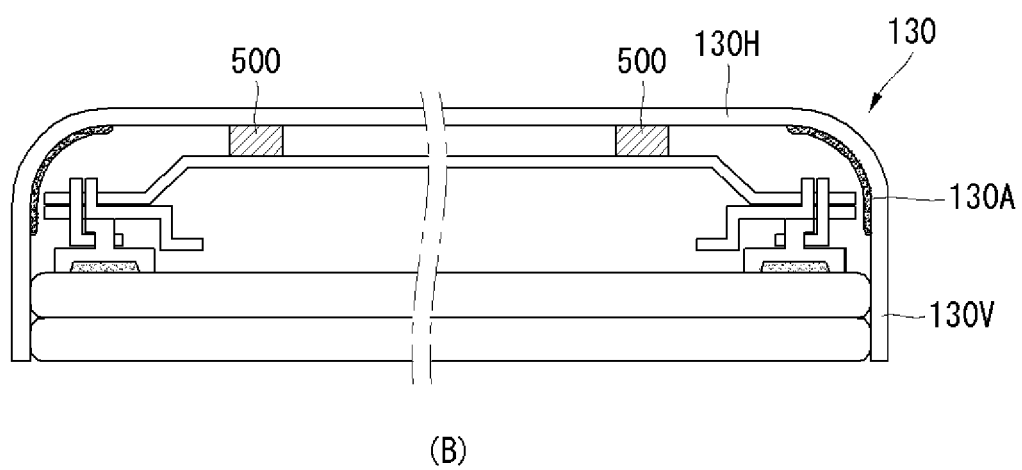

As shown in (B) of FIG. 37 which is a cross-sectional view taken along line B1-B2 of (A) of FIG. 37 in a transverse direction of the first direction DRH of the display panel 100, both sides of the display panel 100 may be covered by the vertical part 130V of the back cover 130.

Figure 38:
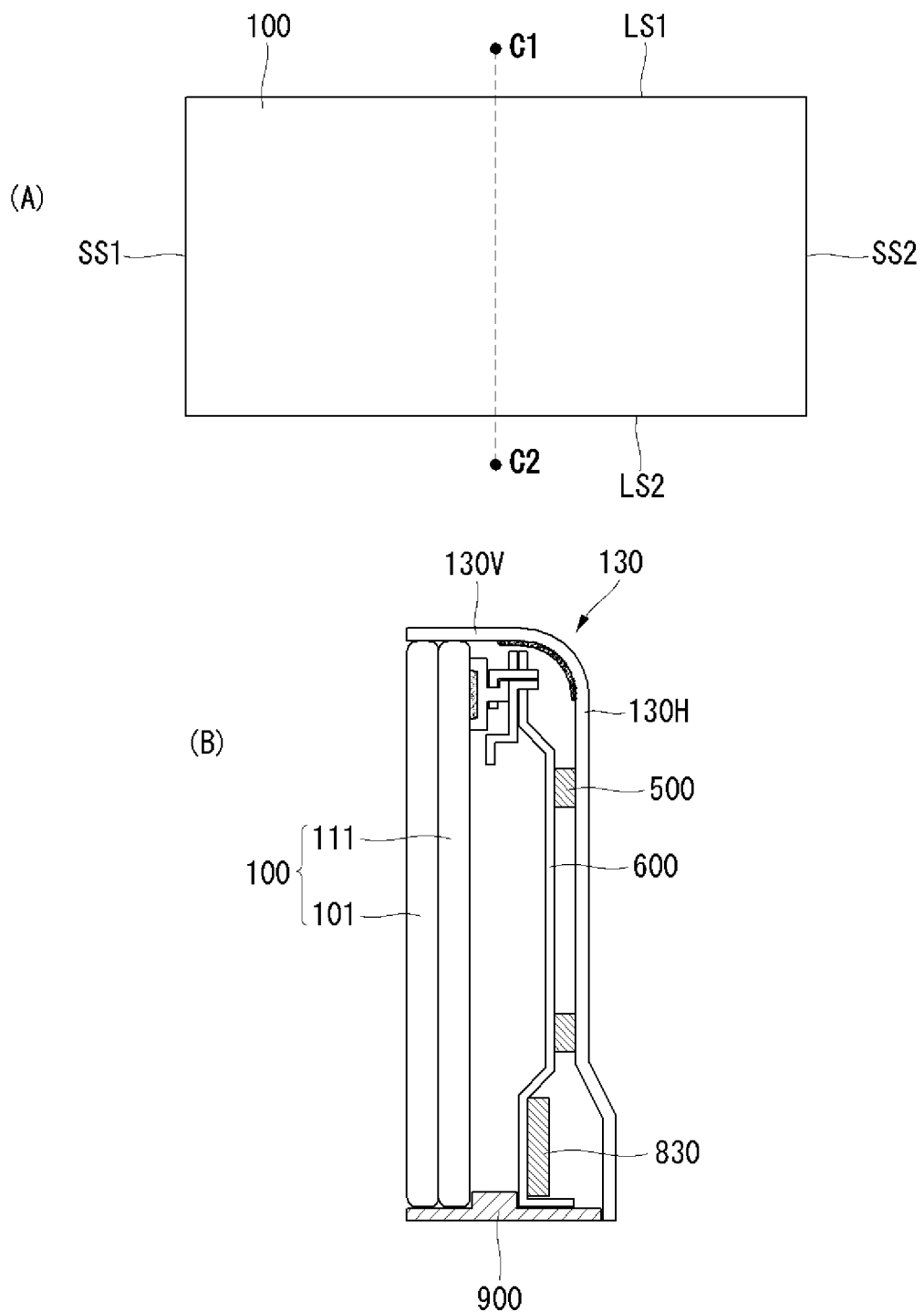

As shown in (B) of FIG. 38 which is a cross-sectional view taken along line C1-C2 of (A) of FIG. 38 in a longitudinal direction of the first direction DRH of the display panel 100, one side of the display panel 100 may be covered by the vertical part 130V of the back cover 130, and the bottom cover 900 may be positioned on the other side of the display panel 100.

Namely, one side of the display panel 100 may be covered by the back cover 130 in the longitudinal direction, but the other side of the display panel 100, i.e., a space between the display panel 100 and the back cover 130 may be opened.

The bottom cover 900 may support the display panel 100.

Further, the bottom cover 900 may be connected to the frame 1600 and/or the back cover 130.

Figure 39:
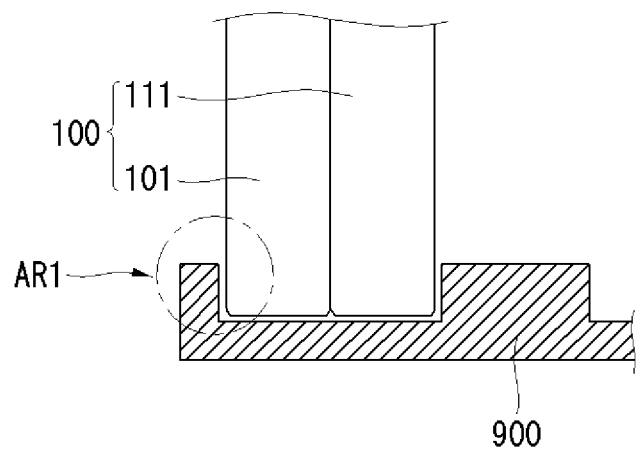

As shown in FIG. 39, the bottom cover 900 may cover a portion of the front surface of the display panel 100 as indicated in a first area AR1.

More specifically, as shown in FIGS. 37 and 38, the edge of the front surface of the display panel 100 may be exposed in a first short side SS1, a second short side SS2, and a first long side LS1 of the display panel 100. The edge of the front surface of the display panel 100 may be covered by the bottom cover 900 in a second long side LS2 of the display panel 100.

Figure 40:
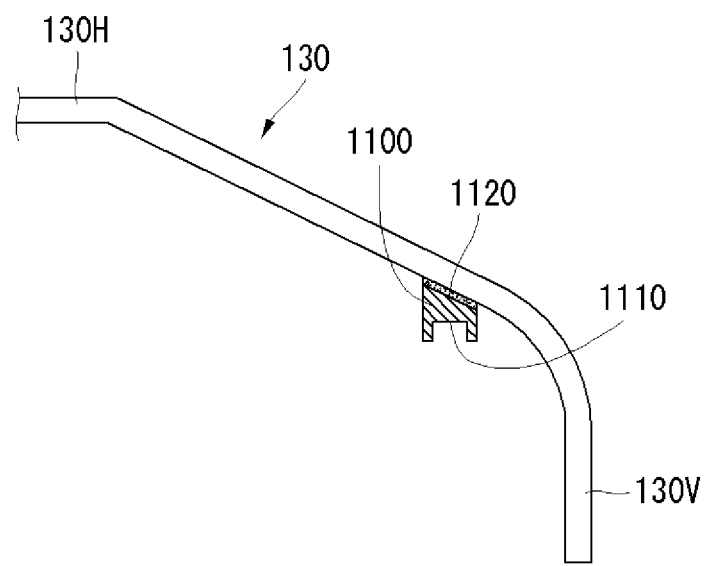

As shown in FIG. 40, a guide part 1100 may be disposed inside the back cover 130. The guide part 1100 may be connected to the back cover 130 through the welding method. Alternatively, an adhesive layer 1120 may be disposed between the guide part 1100 and an inner surface of the back cover 130, thereby attaching the guide part 1100 to the back cover 130.

The guide part 1100 may include a groove 1110.

A predetermined structure may be inserted into the groove 1110 of the guide part 1100.

Figure 41:
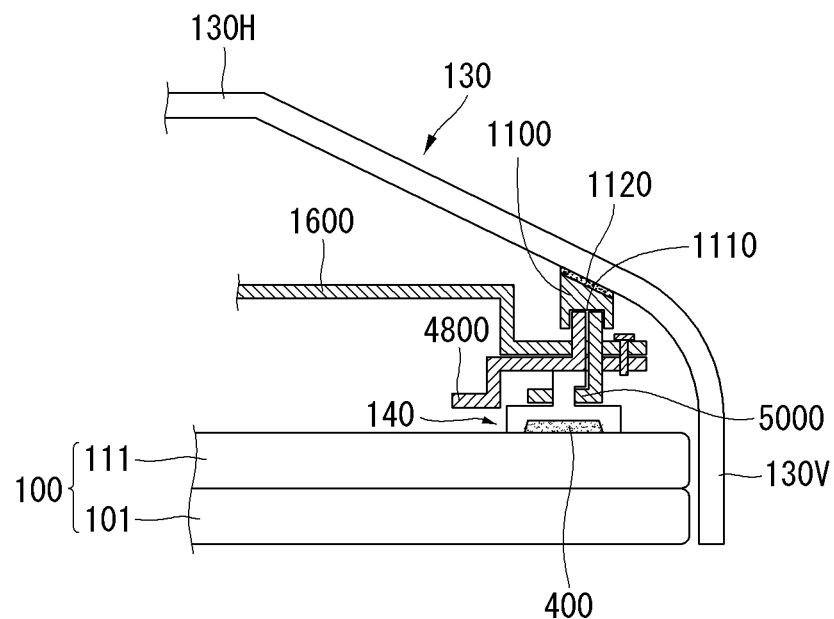

For example, as shown in FIG. 41, an end of the connection frame 5000 and an end of the auxiliary bracket 4800 may be inserted into the groove 1110 of the guide part 1100.

Figure 42:
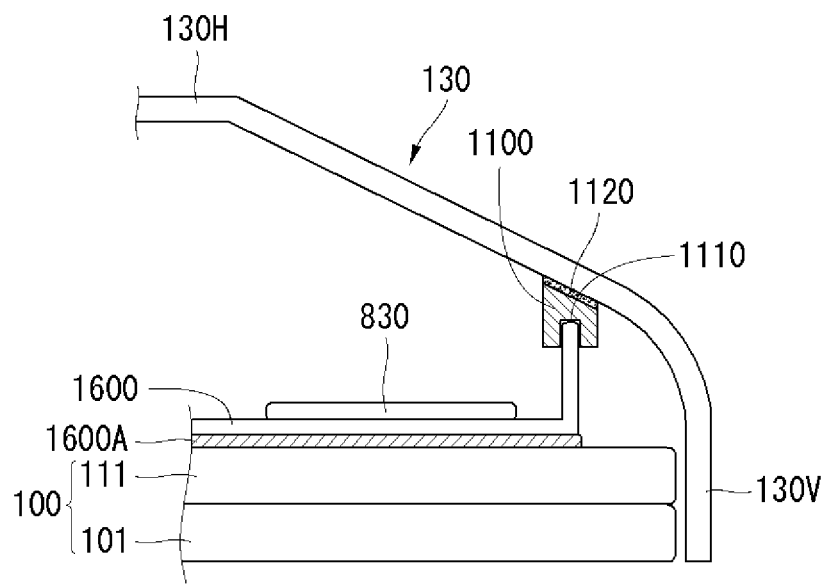

Alternatively, as shown in FIG. 42, an end of the frame 1600 may be inserted into the groove 1110 of the guide part 1100, if necessary or desired.

FIGS. 43 to 54 illustrate configuration of a fastening part. In the following description, the descriptions of the configuration and the structure described above are omitted.

Configuration of a fastening part for connecting the frame 1600 with the back cover 130 is described below.

Figure 43:
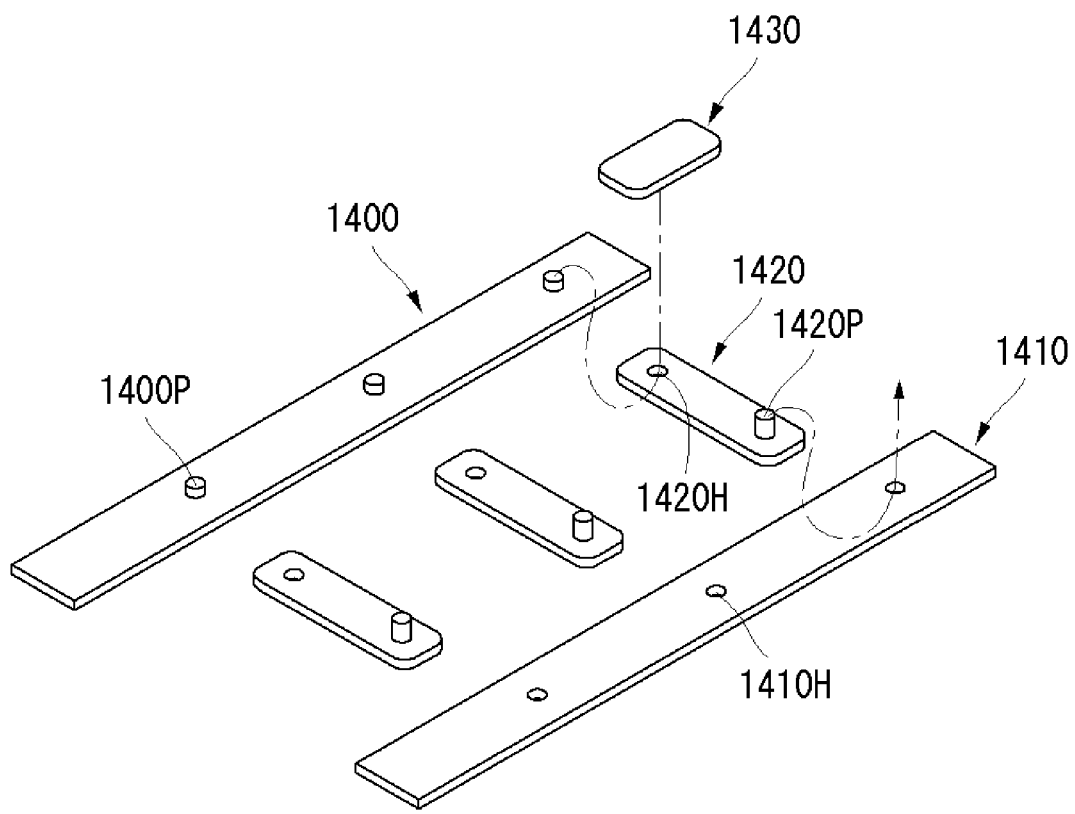
FIGS. 43 to 54 illustrate configuration of a fastening part.

As sown in FIG. 43, a fastening part according to the embodiment of the disclosure may include a first plate 1400 and a second plate 1410 positioned on the frame 1600, a connection plate 1420 for connecting the first plate 1400 with the second plate 1410, and a joint fan 1430 positioned on the connection plate 1420. The fastening part according to the embodiment of the disclosure may further include a supporter which is positioned on the back cover 130 and includes a hole corresponding to the joint fan 1430. The supporter is described later.

The connection plate 1420 may be movably connected with the first plate 1400 and the second plate 1410.

For this, the first plate 1400 may include a first protrusion 1400P, and the connection plate 1420 may include a hole 1420H corresponding to the first protrusion 1400P. Further, the connection plate 1420 may include a second protrusion 1420P, and the second plate 1410 may include a hole 1410H corresponding to the second protrusion 1420P.

Figure 44:
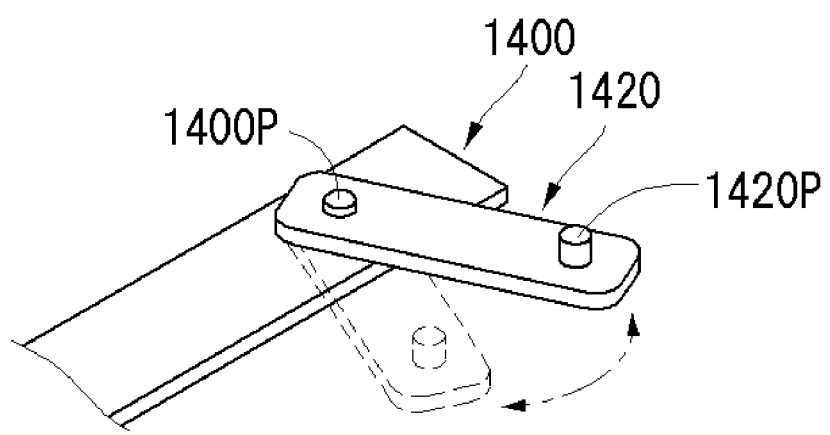

As shown in FIG. 44, the connection plate 1420 may rotate using the first protrusion 1400P as a shaft in a state where the first protrusion 1400P of the first plate 1400 is inserted into the hole 1420H of the connection plate 1420.

Figure 45:
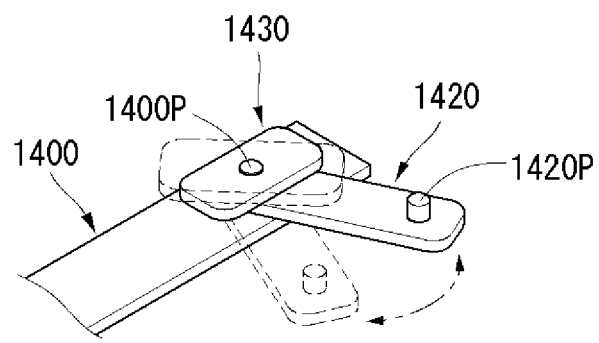

As shown in FIG. 45, the joint fan 1430 may be connected to the connection plate 1420 at a fastening position between the first plate 1400 and the connection plate 1420. Hence, when the connection plate 1420 rotates using the first protrusion 1400P as the shaft, the joint fan 1430 may rotate around a rotation shaft of the connection plate 1420 along with the connection plate 1420.

The connection plate 1420 is movable in a state where the second protrusion 1420P of the connection plate 1420 is inserted into the hole 1410H of the second plate 1410.

Figure 46:
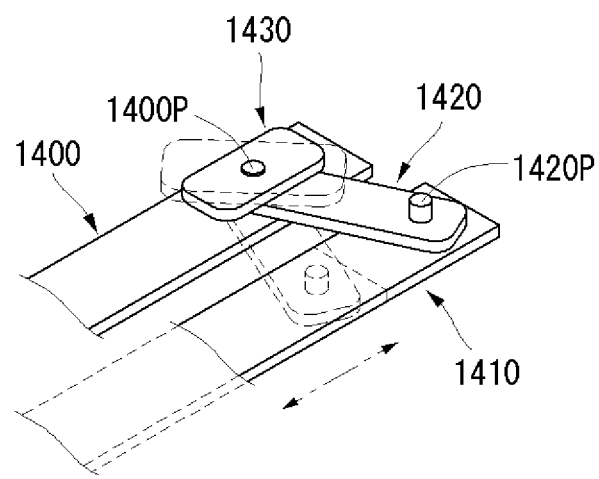

For example, as shown in FIG. 46, when the connection plate 1420 rotates using the first protrusion 1400P as the shaft, the second plate 1410 may move up and down while being linked with the movement of the connection plate 1420. Hence, the joint fan 1430 may rotate when the second plate 1410 moves up and down.

The fastening part having the above-described configuration may be positioned in an area corresponding to a short side of the frame 1600.

Figure 47:
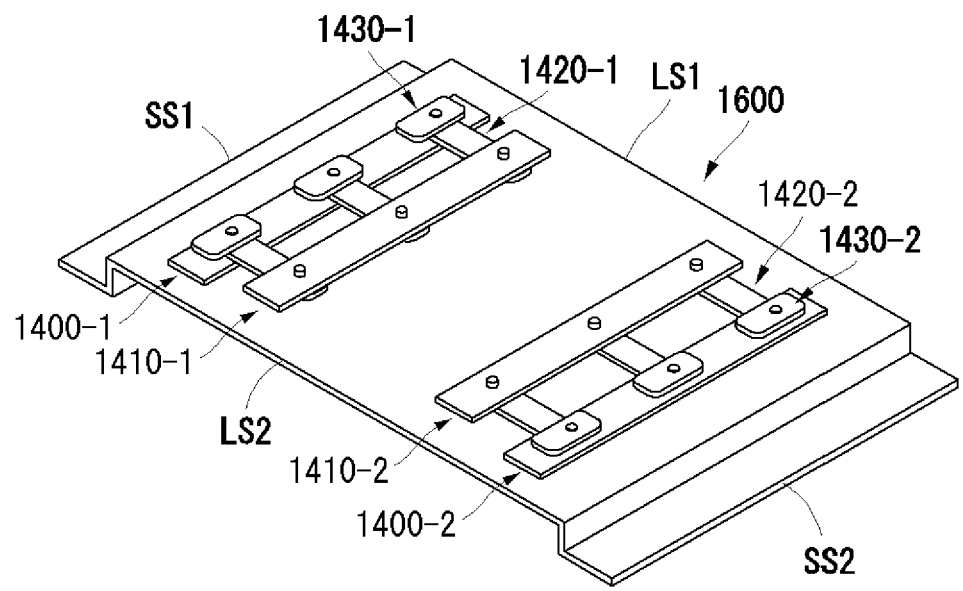

For example, as shown in FIG. 47, the fastening part may include a first fastening part and a second fastening part. The first fastening part may be positioned in a first short side SS1 of the frame 1600 and may include a 1-1 plate 1400-1, a 2-1 plate 1410-1, a first connection plate 1420-1, and a first joint fan 1430-1. The second fastening part may be positioned in a second short side SS2 of the frame 1600 and may include a 1-2 plate 1400-2, a 2-2 plate 1410-2, a second connection plate 1420-2, and a second joint fan 1430-2.

Figure 48:
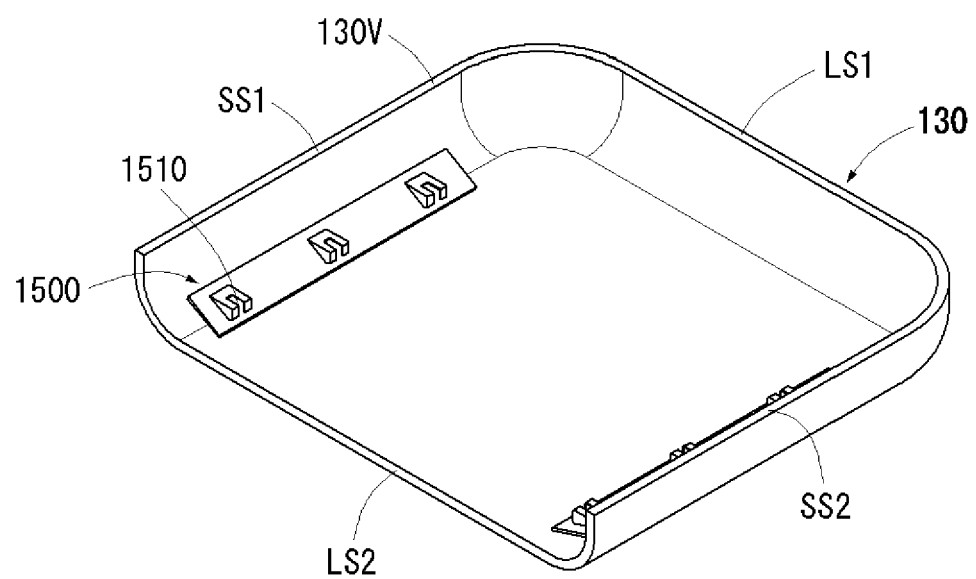

As shown in FIG. 48, supporters 1500 may be disposed on the back cover 130. The supporter 1500 may include holes 1510 into which the joint fan 1430 is inserted.

The supporters 1500 may be respectively disposed in a first short side SS1 and a second short side SS2 of the back cover 130 at a location corresponding to the fastening part.

Figure 49:
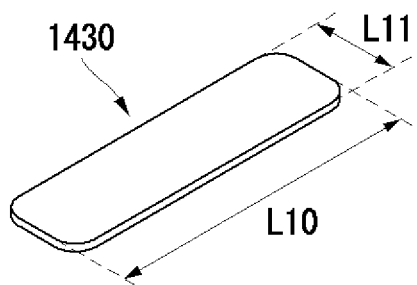

As shown in FIG. 49, a length and a width of the joint fan 1430 may be different from each other.

For example, a length L10 of the joint fan 1430 may be greater than a width L11 of the joint fan 1430.

A longitudinal direction of the joint fan 1430 may be changed by the rotation of the connection plate 1420.

Figure 50:
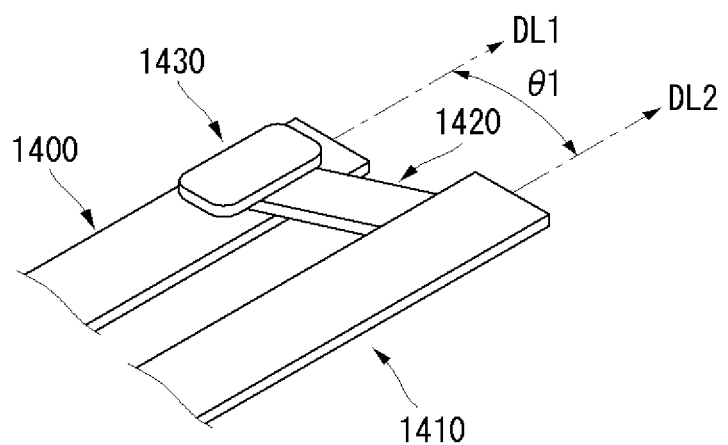

For example, as shown in FIG. 50, when the second plate 1410 is disposed at a predetermined first position, it is assumed that an angle between a longitudinal direction DL1 of the joint fan 1430 and a longitudinal direction DL2 of the second plate 1410 is a first angle θ1. In addition, as shown in FIG. 51, when the second plate 1410 is disposed at a predetermined second position different from the first position, it is assumed that an angle between the longitudinal direction DL1 of the joint fan 1430 and the longitudinal direction DL2 of the second plate 1410 is a second angle θ2.

For example, the first angle θ1 and the second angle θ2 may be different from each other.

In the embodiment of the disclosure, because the length L10 and the width L11 of the joint fan 1430 are different from each other, the first angle θ1 and the second angle θ2 may be different from each other.

Figure 51:
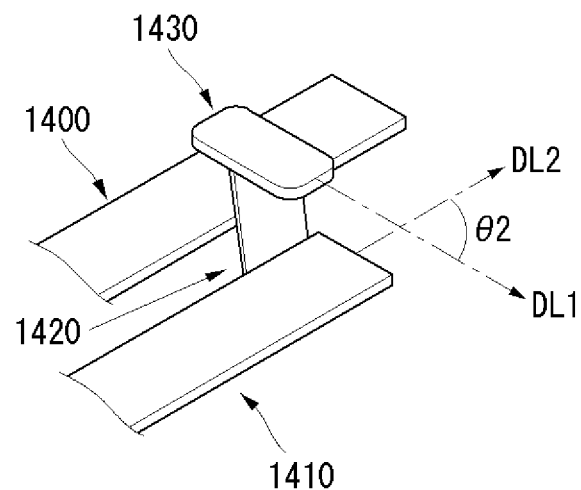

When comparing the first angle θ1 shown in FIG. 50 with the second angle θ2 shown in FIG. 51, the first angle θ1 may be less than the second angle θ2.

Figure 52:
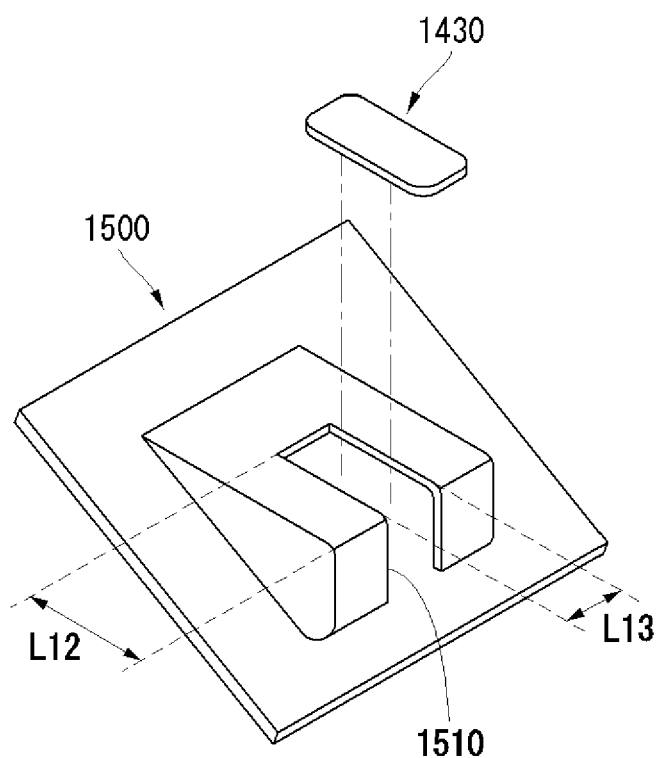

In this instance, as shown in FIG. 52, when the second plate 1410 is disposed at the predetermined second position, the joint fan 1430 may be inserted into the hole 1510 of the supporter 1500 or may be detached from the hole 1510.

For this, as shown in FIG. 52, a width L12 of the hole 1510 of the supporter 1500 in a direction of the long sides LS1 and LS2 of the back cover 130 may be greater than a width L13 of the hole 1510 of the supporter 1500 in a direction of the short sides SS1 and SS2 of the back cover 130.

In other words, when the second plate 1410 is disposed at the predetermined second position, the joint fan 1430 may be parallel to the long sides LS1 and LS2 of the back cover 130.

Hence, the joint fan 1430 may be inserted into the hole 1510, in which its width L12 in the direction of the long sides LS1 and LS2 of the back cover 130 is greater than its width L13 in the direction of the short sides SS1 and SS2 of the back cover 130, or may be detached from the hole 1510.

Figure 53:
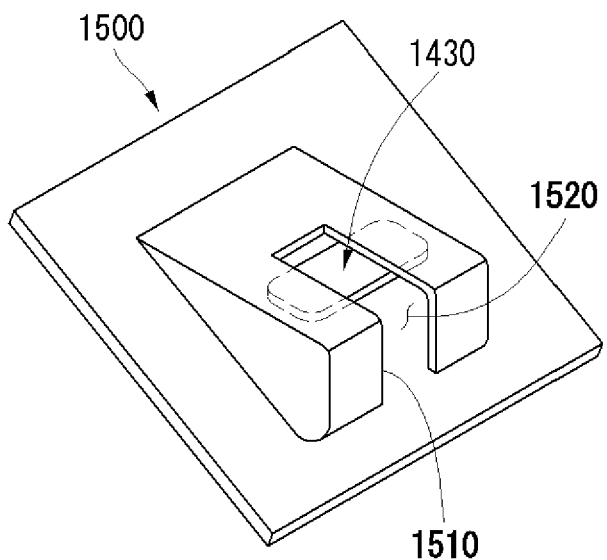

As shown in FIG. 53, when the second plate 1410 moves from the second position to the first position, the joint fan 1430 may rotate in a state where the joint fan 1430 is inserted into the hole 1510 of the supporter 1500. In this instance, the joint fan 1430 may be coupled with the supporter 1500, and thus the frame 1500 and the back cover 130 may be connected to each other. Namely, the display module and the back cover 130 may be connected to each other.

As described above, a space capable of inserting and rotating the joint fan 1430 between the supporter 1500 and the back cover 130 may be provided between the supporter 1500 and the back cover 130, so that the joint fan 1430 rotates inside the hole 1510 of the supporter 1500.

In the above description, the joint fan 1430 is inserted into the hole 1510 of the supporter 1500 or detached from the hole 1510 in the state illustrated in FIG. 51, and also the joint fan 1430 is connected to the supporter 1500 in the state where the joint fan 1430 is inserted into the hole 1510 of the supporter 1500 in FIG. 50. However, the embodiment of the disclosure is not limited thereto.

For example, the joint fan 1430 may be inserted into the hole 1510 of the supporter 1500 or detached from the hole 1510 in the state illustrated in FIG. 50, and also the joint fan 1430 may be connected to the supporter 1500 in the state where the joint fan 1430 is inserted into the hole 1510 of the supporter 1500 in FIG. 51.

Figure 54:
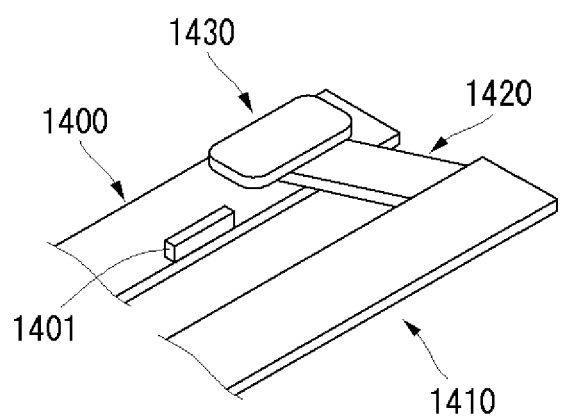

As shown in FIG. 54, a block wall 1401 may be formed on the first plate 1400. The block wall 1401 may block the excessive movement of the second plate 1410 and/or the connection plate 1420.

FIGS. 55 to 68 illustrate another configuration of the fastening part. In the following description, the descriptions of the configuration and the structure described above are omitted.

Another configuration of the fastening part for connecting the frame 1600 with the back cover 130 is described below.

Figure 55:
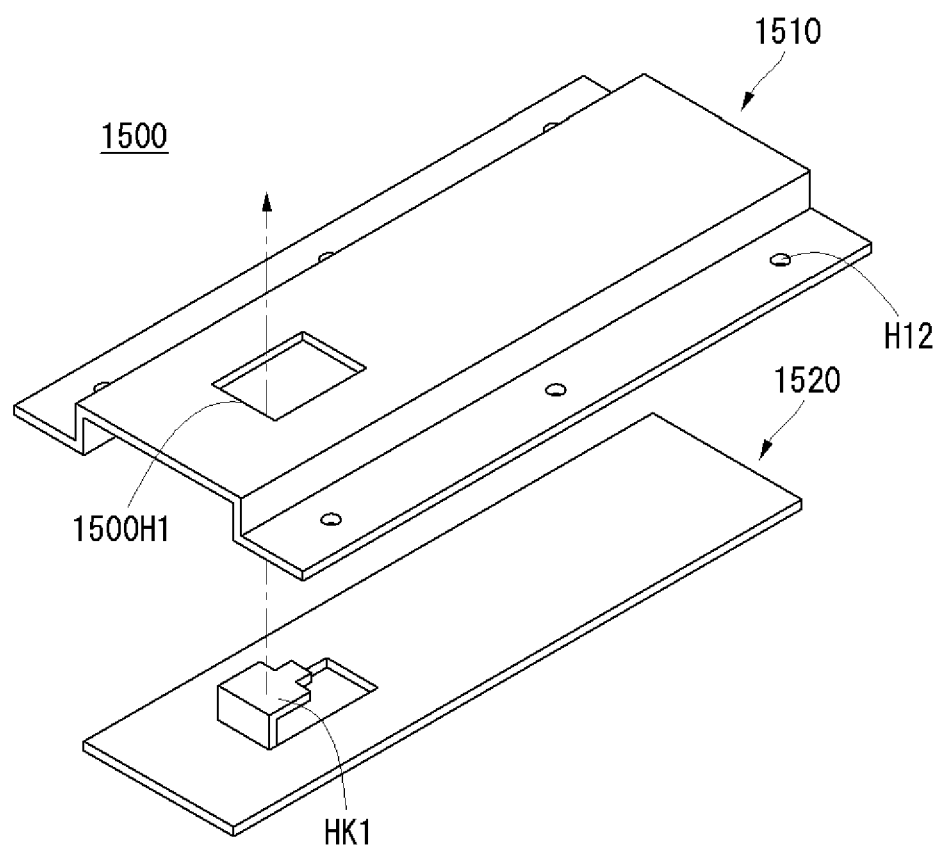
FIGS. 55 to 68 illustrate another configuration of a fastening part.

As shown in FIG. 55, a fastening part 1500 according to the embodiment of the disclosure may include a base part 1510 (also referred to herein as a base) and a moving part 1520 (also referred to herein as a plate) which is movably connected to the base part 1510 and includes a first hook HK1. Further, although not shown, the fastening part 1500 may further include a connection part and a handle part. The connection part may be a rail having a plurality of hooks corresponding to the first hook HK1, and the handle part may be a lever used to slide the plate 1520 (moving part) in a prescribed direction relative to the base 1510. The connection part and the handle part are described in detail later.

The base part 1510 may include a first opening 1500H1. The first hook HK1 may pass through the first opening 1500H1 and may be exposed.

Further, the base part 1510 may include a plurality of holes H12. The plurality of holes H12 may be used to connect the base part 1510 to the back cover 130 or the frame 1600.

Figure 56:
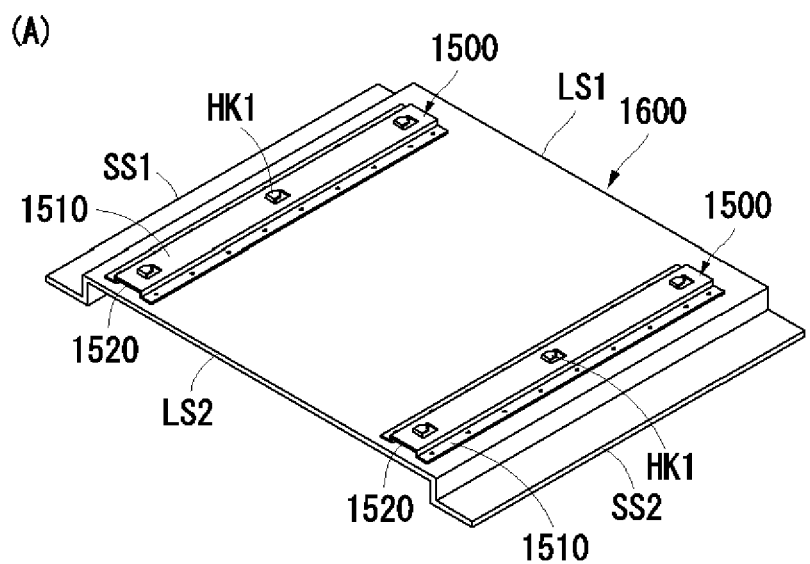
Figure 56:
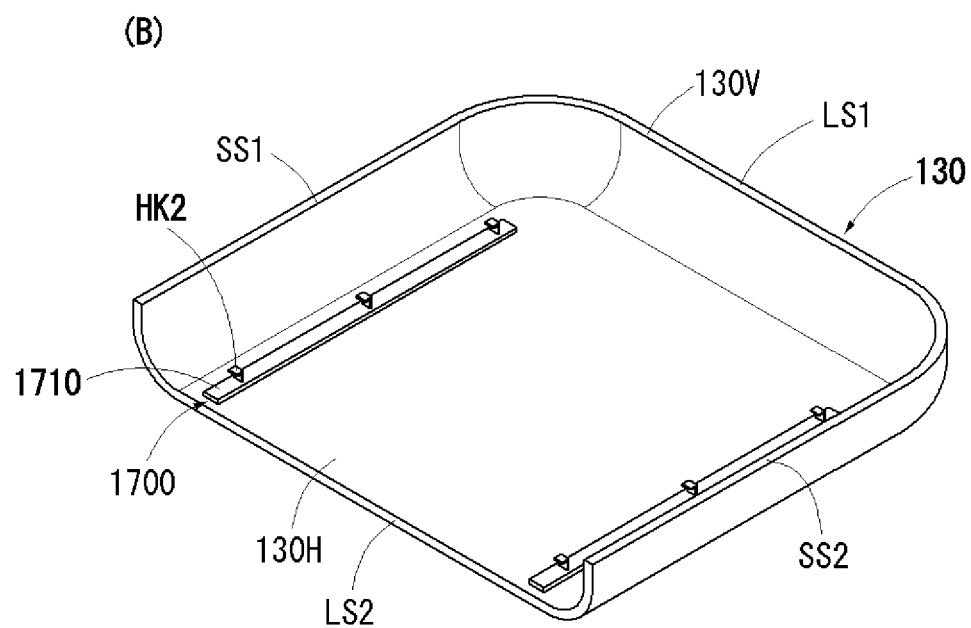

As shown in (A) of FIG. 56, the base part 1510 may be connected to the frame 1600. In this instance, the moving part 1520 may be positioned between the frame 1600 and the base part 1510. More specifically, the base part 1510 may be positioned in an area corresponding to the short sides SS1 and SS2 of the frame 1600.

Further, as shown in (B) of FIG. 56, the fastening part 1500 may include a connection part 1700 positioned on the back cover 130. The connection part 1700 may include a second hook HK2 corresponding to a first hook HK1 positioned on the moving part 1520. The connection part 1700 may be positioned in an area corresponding to the short sides SS1 and SS2 of the back cover 130.

Figure 57:
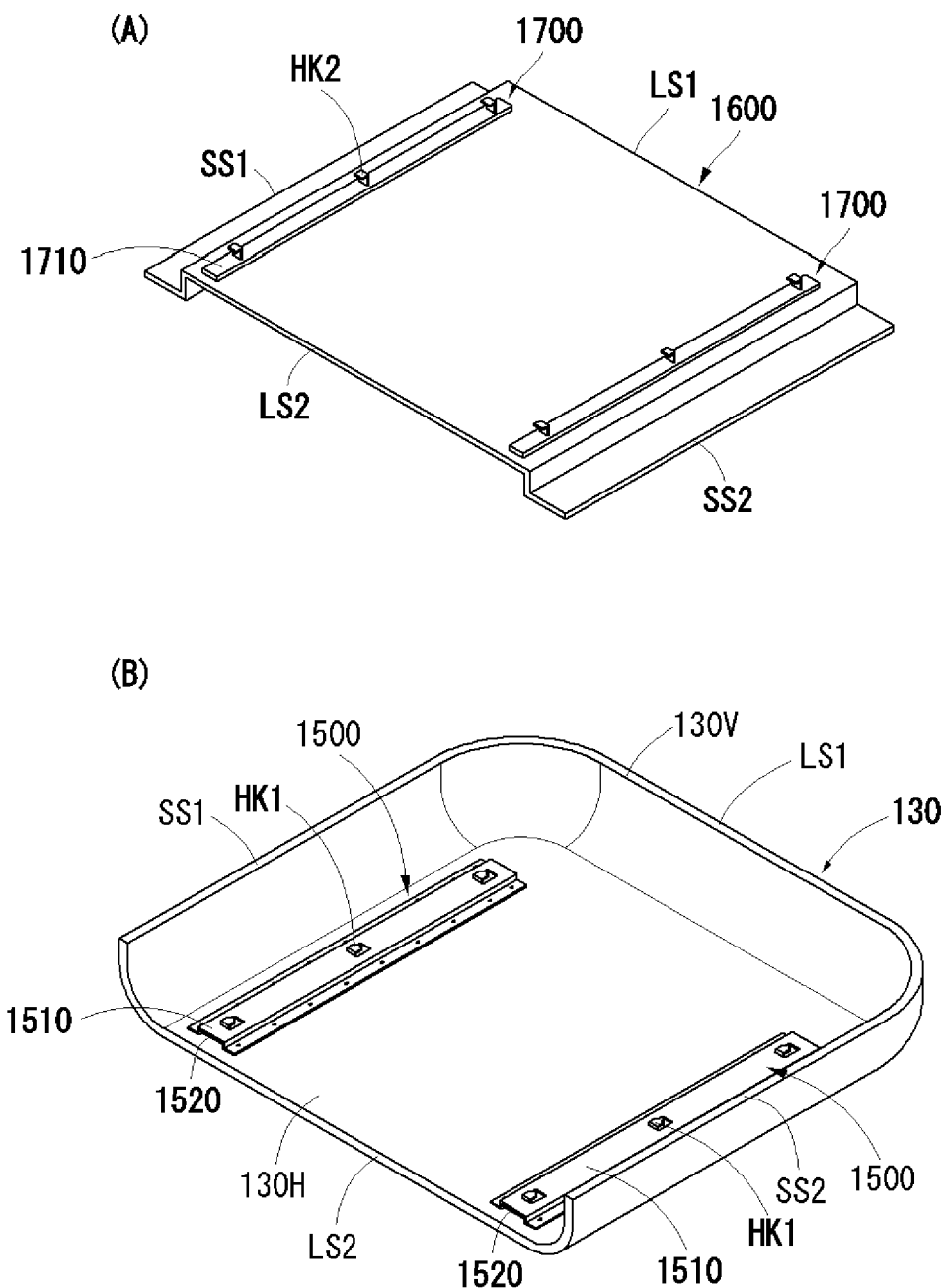

Alternatively, as shown in (B) of FIG. 57, the base part 1510 may be disposed on the back cover 130. In this instance, the moving part 1520 may be positioned between the back cover 130 and the base part 1510. More specifically, the base part 1510 may be positioned in an area corresponding to the short sides SS1 and SS2 of the back cover 130.

Further, as shown in (A) of FIG. 57, the connection part 1700 may be disposed on the frame 1600. More specifically, the connection part 1700 may be positioned in an area corresponding to the short sides SS1 and SS2 of the frame 1600.

The fastening part 1500 may further include a spring part 1530. As disclosed herein, the spring part 1530 may be a spring.

Figure 58:
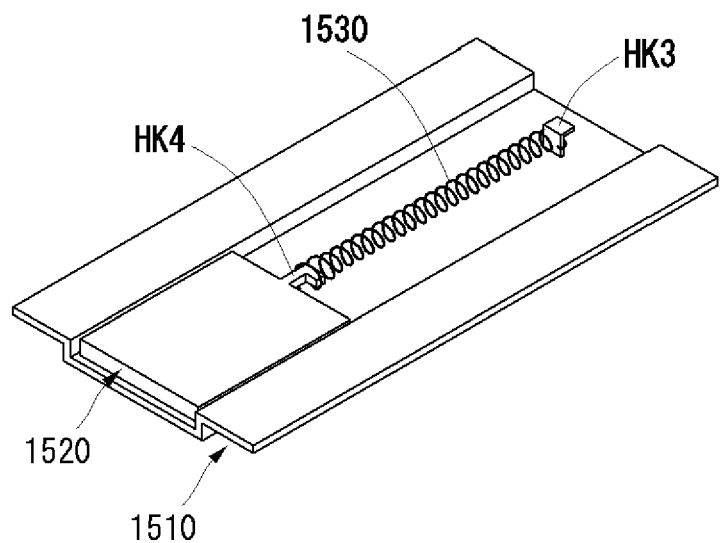

As shown in FIG. 58, one end of the spring part 1530 may be connected to the base part 1510, and the other end may be connected to the moving part 1520.

For this, the base part 1510 may include a third hook HK3, and the moving part 1520 may include a fourth hook HK4. In this instance, one end of the spring part 1530 may be connected to the third hook HK3, and the other end may be connected to the fourth hook HK4.

Figure 59:
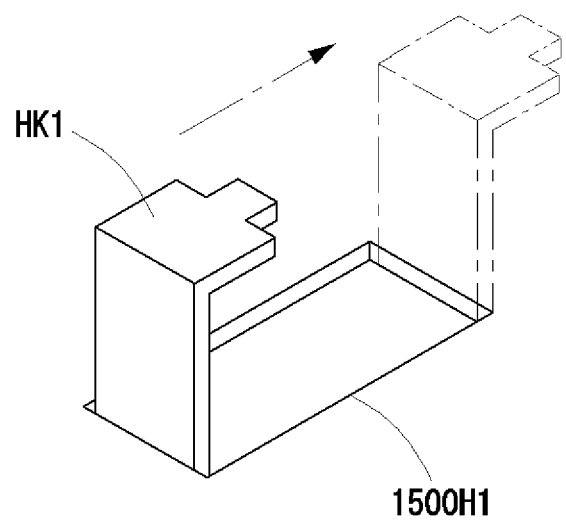

As shown in FIG. 59, the first hook HK1 of the moving part 1520 may move forward and/or backward inside the first opening 1500H1 of the base part 1510.

Figure 60:
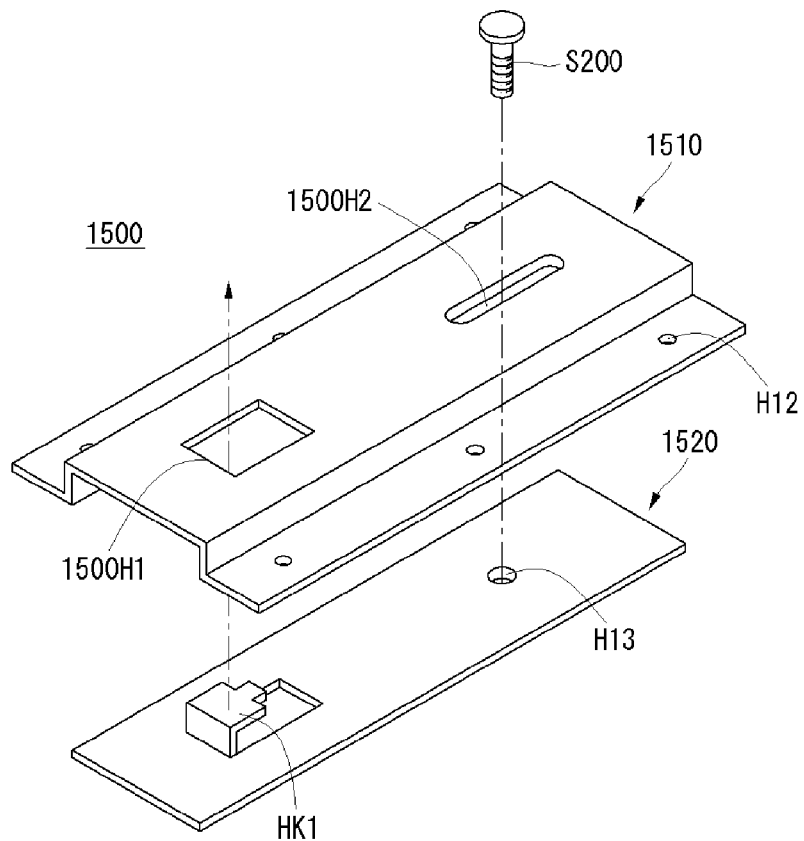

As shown in FIG. 60, the base part 1510 may further include a second opening 1500H2, and the moving part 1520 may further include a hole H13 corresponding to the second opening 1500H2.

A predetermined fastening member S200 may pass through the second opening 1500H2 of the base part 1510 and may be fastened to the hold H13 of the moving part 1520. The fastening member S200 may be a guide protrusion that extends from the plate 1520 through the second opening 1500H2, and the second opening 1500H2 may have a prescribed shape (e.g., slot or slit) to guide movement of the guide plate using guide protrusion S200.

Figure 61:
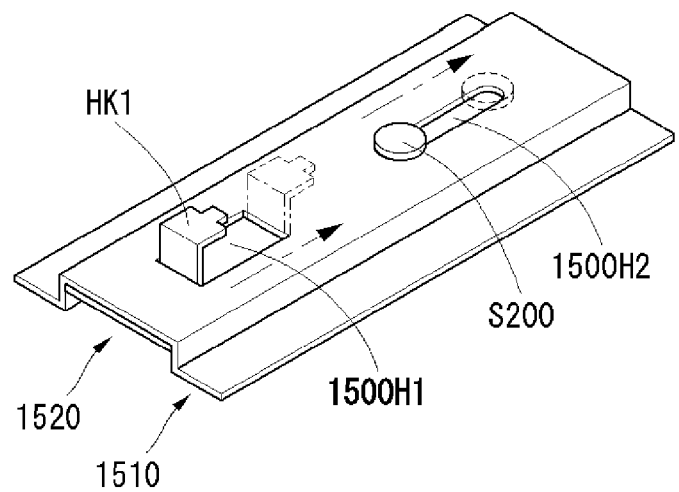

As shown in FIG. 61, the fastening member S200 is movable inside the second opening 1500H2 while being linked with the first hook HK1.

Figure 62:
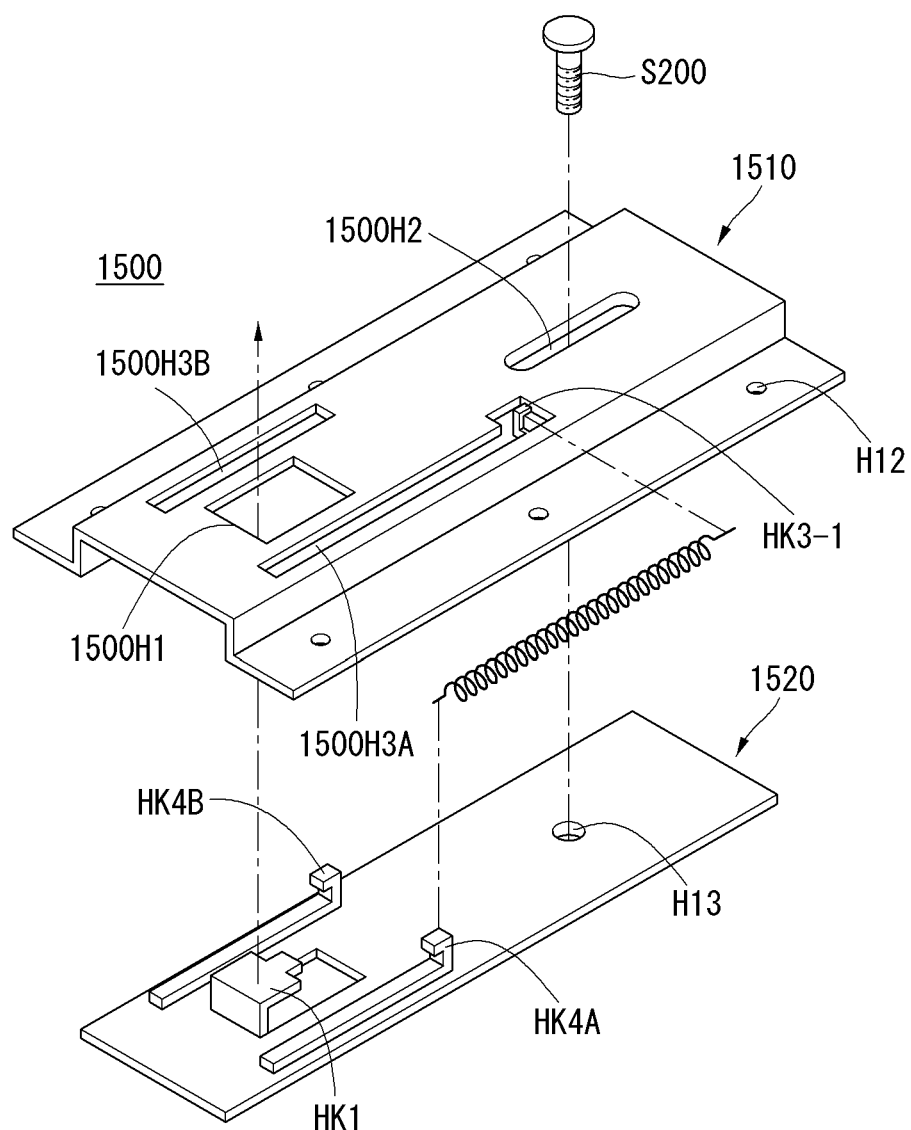
Figure 63:
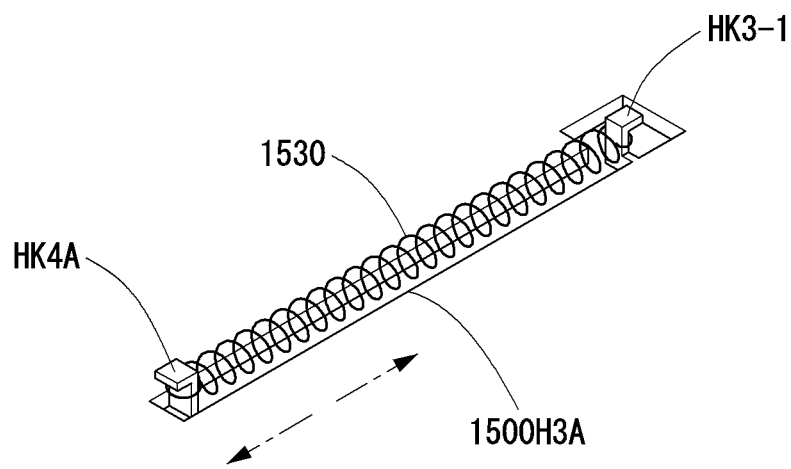

As shown in FIG. 62, the base part 1510 may further include third openings 1500H3A and 1500H3B and a third hook HK3-1 (refer to FIG. 63). The third hook HK3-1 may be different from the third hook HK3 shown in FIG. 58 in the position and/or the shape, but may be similar to the third hook HK3 shown in FIG. 58 in that one end of the spring part 1530 is connected to it.

More specifically, the third opening of the base part 1510 may include the 3-1 opening 1500H3A and the 3-2 opening 1500H3B. The third hook HK3-1 may be disposed at a position corresponding to at least one of the 3-1 opening 1500H3A and the 3-2 opening 1500H3B.

The moving part 1520 may further include fourth hooks HK4A and HK4B which pass through the third openings 1500H3A and 1500H3B and are exposed.

The fourth hook of the moving part 1520 may include the 4-1 hook HK4A and the 4-2 hook HK4B. The other end of the spring part 1530 may be connected to at least one of the 4-1 hook HK4A or the 4-2 hook HK4B.

The 4-1 hook HK4A may be different from the fourth hook HK4 shown in FIG. 58 in the position and/or the shape, but may be similar to the fourth hook HK4 shown in FIG. 58 in that the other end of the spring part 1530 is connected to it.

In a state where the base part 1510 is coupled with the moving part 1520, the 4-1 hook HK4A may be exposed through the 3-1 opening 1500H3A, and the 4-2 hook HK4B may be exposed through the 3-2 opening 1500H3B.

As shown in FIG. 63, the spring part 1530 may be exposed through the 3-1 opening 1500H3A.

A length of the spring part 1530 may change depending on the movement of the moving part 1520 in a state where the base part 1510 is fixed to the frame 1600 or the back cover 130.

Figure 64:
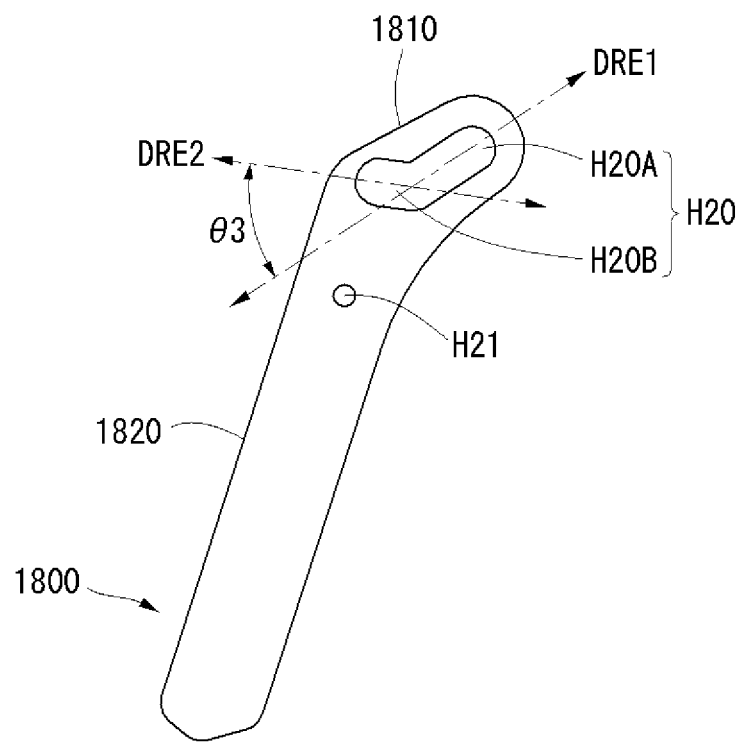

As shown in FIG. 64, a handle part 1800 included in the fastening part 1500 may be movably connected to the base part 1510 and may change the length of the spring part 1530 by a rotation of the handle part 1800. The handle part 1800 may also be a lever.

The handle part 1800 may include a first portion 1810, a first hole H20 formed in the first portion 1810, a second portion 1820 connected to the first portion 1810, and a second hole H21 formed in the second portion 1820. The first portion 1810 and the second portion 1820 may be referred to as a first arm and a second arm, respectively.

The handle part 1800 may be movably connected to the base part 1510 through the first hole H20. The first hole H20 may include a first extension H20A extending in a first extension direction DRE1 and a second extension H20B extending in a second extension direction DRE2 crossing the first extension direction DRE1. In other words, the first extension H20A may extend at a first angle relative to the first portion 1810 and the second extension H20B may extend at a second angle relative to the first portion 1820, the first and second angles being different angles.

An angle θ3 between the first extension direction DRE1 and the second extension direction DRE2 may be about 0° to 90°. Moreover, a size of the second extension H20B may be less than a size of the first extension H20A.

Figure 65:
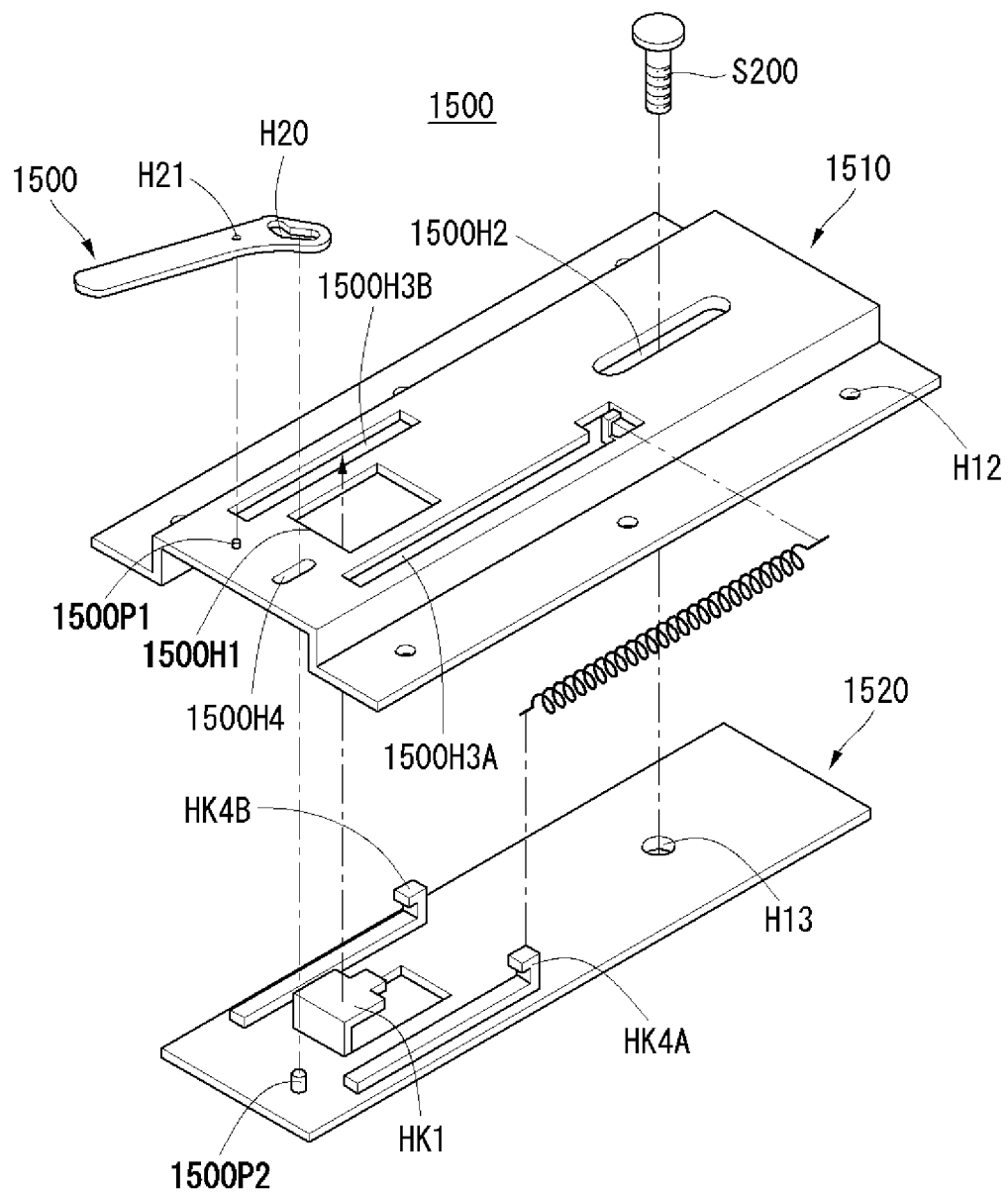

As shown in FIG. 65, the base part 1510 may include a first protrusion 1500P1 inserted into the second hole H21 of the handle part 1800. The moving part 1520 may include a second protrusion 1500P2 which passes through the first hole H20 of the handle part 1800 and is movable inside the first hole H20.

The handle part 1800 may rotate using the first protrusion 1500P1 as a shaft.

Figure 66:
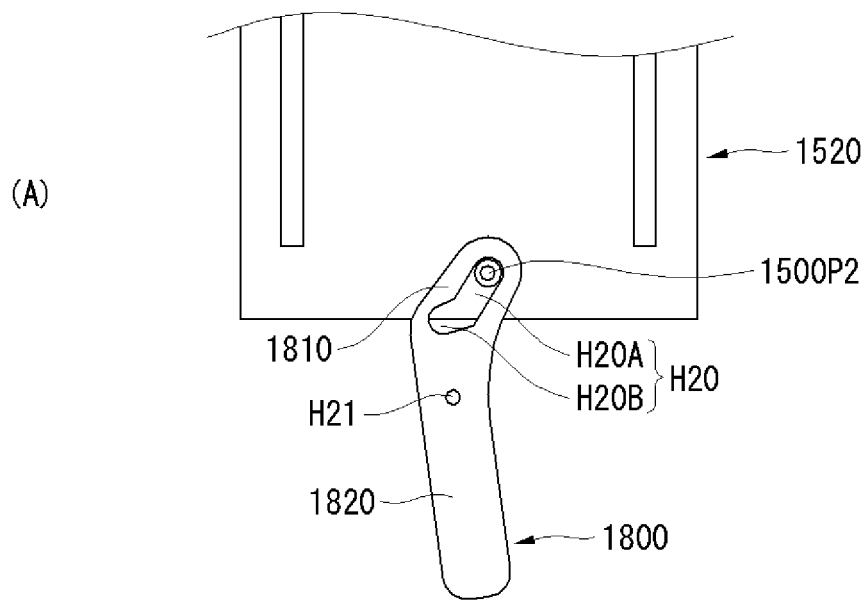
Figure 66:
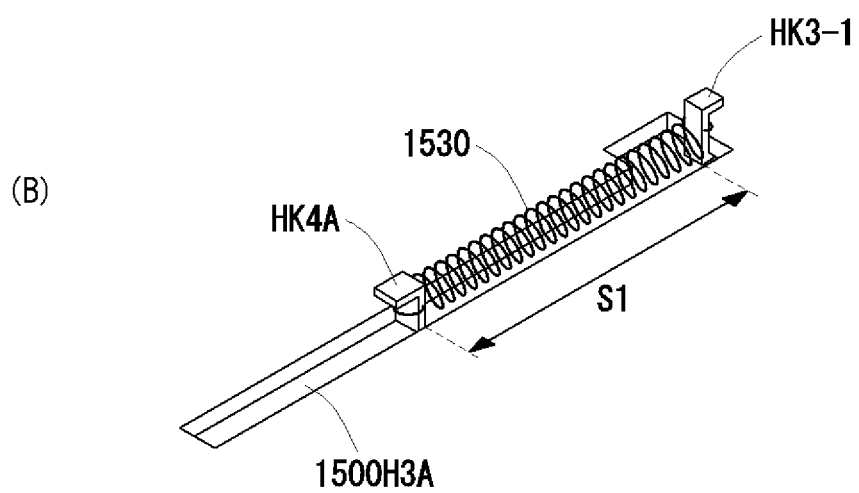

When the second protrusion 1500P2 of the moving part 1520 is positioned on the first extension H20A as shown in (A) of FIG. 66, a length S1 of the spring part 1530 may be maintained in a relatively short state by its elasticity as shown in (B) of FIG. 66.

Figure 67:
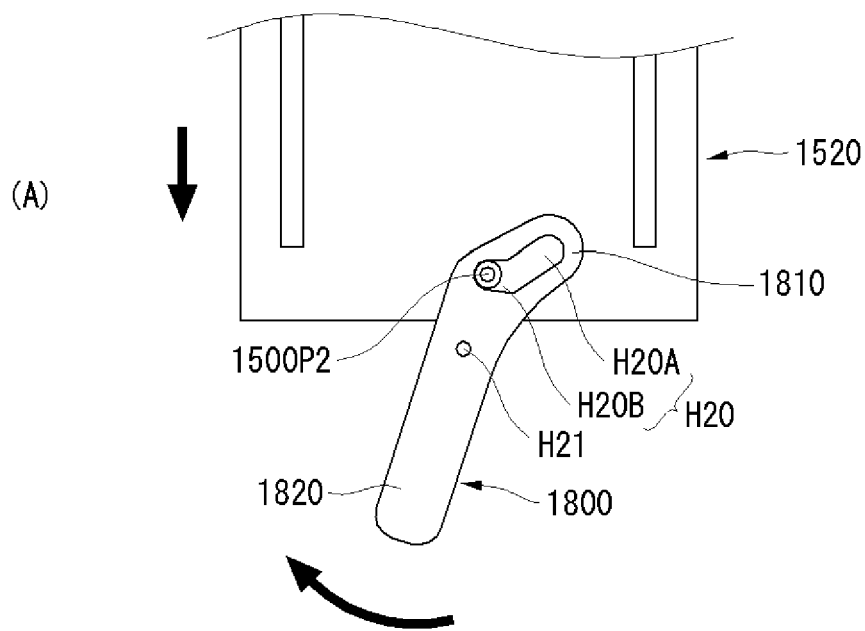
Figure 67:
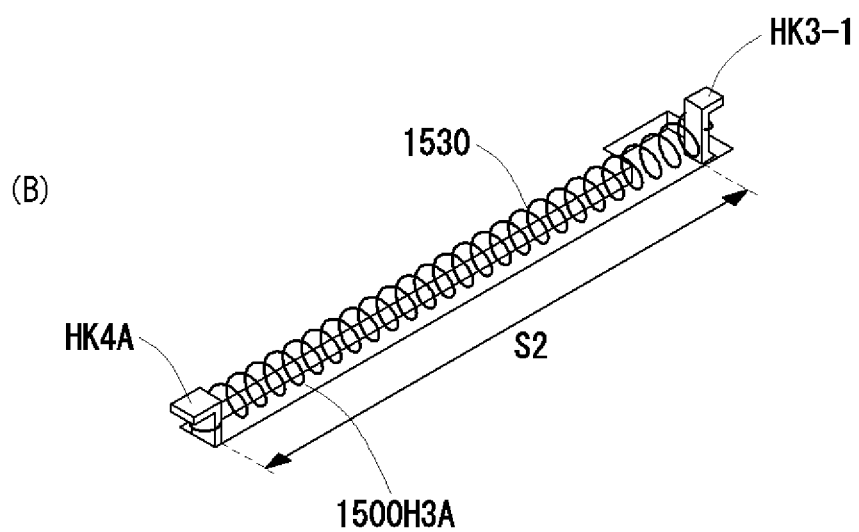
Figure 68:
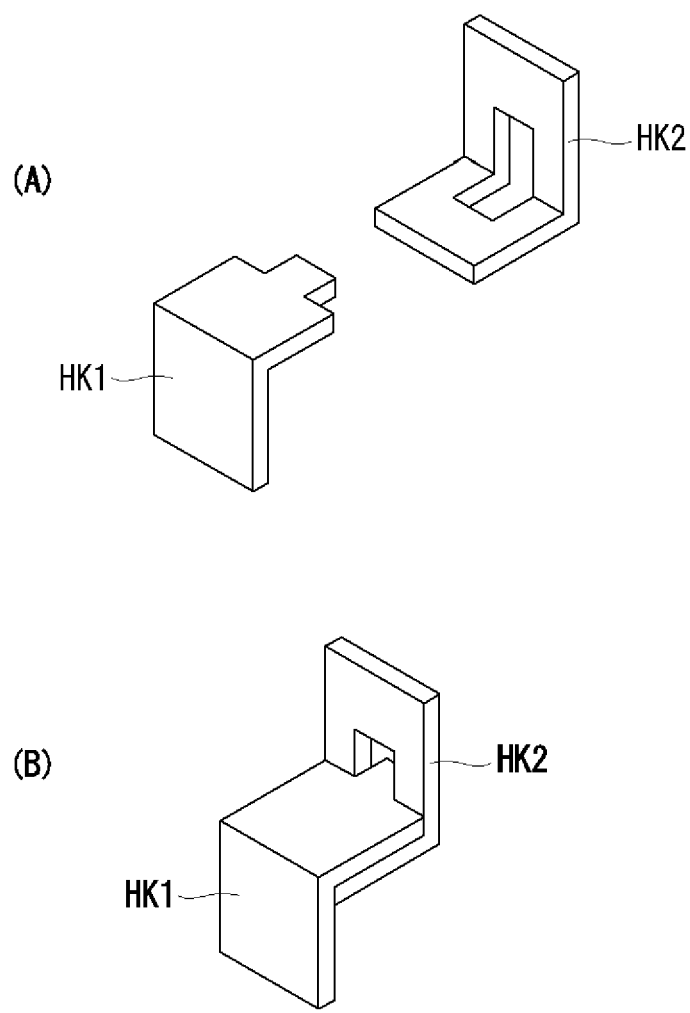

On the other hand, as shown in (A) of FIG. 67, when the handle part 1800 rotates, the second protrusion 1500P2 of the moving part 1520 may move from the first extension H20A to the second extension H20B inside the first hole H20 of the handle part 1800.

As described above, when the second protrusion 1500P2 of the moving part 1520 is positioned on the second extension H20B as shown in (A) of FIG. 67, a pulling force may be applied to the spring part 1530. Hence, as shown in (B) of FIG. 67, a length S2 of the spring part 1530 may relatively lengthen.

In other words, when the second protrusion 1500P2 of the moving part 1520 is positioned on the first extension H20A of the handle part 1800 as shown in (A) of FIG. 66, the length of the spring part 1530 may be referred to as a first length S1. Further, when the second protrusion 1500P2 of the moving part 1520 is positioned on the second extension H20B of the handle part 1800 as shown in (A) of FIG. 67, the length of the spring part 1530 may be referred to as a second length S2. In this instance, the second length S2 may be longer than the first length S1.

When the second protrusion 1500P2 of the moving part 1520 is positioned on the second extension H20B, the second protrusion 1500P2 hangs on the second extension H20B. Hence, the length of the spring part 1530 may be maintained in an increase state.

This may be a phenomenon appearing because the first extension direction DRE1 of the first extension H20A and the second extension direction DRE2 of the second extension H20B are different from each other.

Further, because the second protrusion 1500P2 of the moving part 1520 hangs on the second extension H20B of the first hole H20, the small size of the second extension H20B does not matter. Hence, the size of the second extension H20B may be less than the size of the first extension H20A.

When the second protrusion 1500P2 of the moving part 1520 is positioned on the second extension H20B of the first hole H20 as shown in FIG. 67, the spring part 1530 is pulled. Hence, as shown in (A) of FIG. 68, the first hook HK1 and the second hook HK2 (e.g., on connection part 1700 of FIG. 56) may be detached from each other.

On the other hand, when the second protrusion 1500P2 of the moving part 1520 is positioned on the first extension H20A of the first hole H20 as shown in FIG. 66, the force, which has been applied to the spring part 1530, is removed or becomes weak. Hence, as shown in (B) of FIG. 68, the first hook HK1 and the second hook HK2 may be engaged with each other. As a result, the frame 1600 and the back cover 130 may be connected to each other.

FIGS. 69 to 74 illustrate a fastening part using a spring. In the following description, the descriptions of the configuration and the structure described above are omitted.

Figure 69:
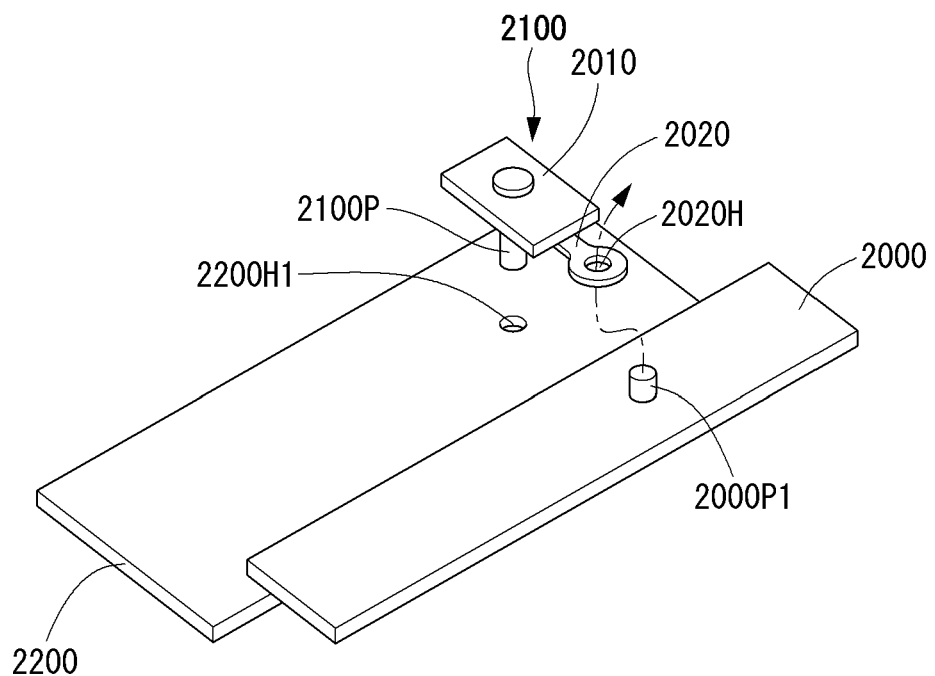
FIGS. 69 to 74 illustrate a fastening part using a spring.

As shown in FIG. 69, a fastening part according to the embodiment of the disclosure may include a third plate 2200 and a fourth plate 2000 positioned on the frame 1600.

The third plate 2200 and the fourth plate 2000 may be connected to each other through a connection part 2100.

The connection part 2100 may include a fan 2010, an extension 2020, and a protrusion 2100P. The fan 2010 and the extension 2020 may rotate using the protrusion 2100P as a shaft.

The fan 2010 and the extension 2020 may be connected to each other. Hence, when the extension 2020 rotates using the protrusion 2100P as the shaft, the fan 2010 may rotate along with the extension 2020.

The fan 2010 may have the same form as the joint fan 1430 described above.

The third plate 2200 may include a hole 2200H1 corresponding to the protrusion 2100P of the connection part 2100.

The fan 2010 and the extension 2020 may rotate using the protrusion 2100P as the shaft in a state where the protrusion 2100P of the connection part 2100 is inserted into the hole 2200H1 of the third plate 2200.

The extension 2020 of the connection part 2100 may include a hole 2020H, and the fourth plate 2000 may include a protrusion 2000P1 corresponding to the hole 2020H of the extension 2020.

The extension 2020 of the connection part 2100 may rotate in a state where the protrusion 2000P1 of the fourth plate 2000 is inserted into the hole 2020H of the extension 2020.

The third plate 2200 and the fourth plate 2000 may independently move in a state where they are connected to each other through the connection part 2100.

Figure 70:
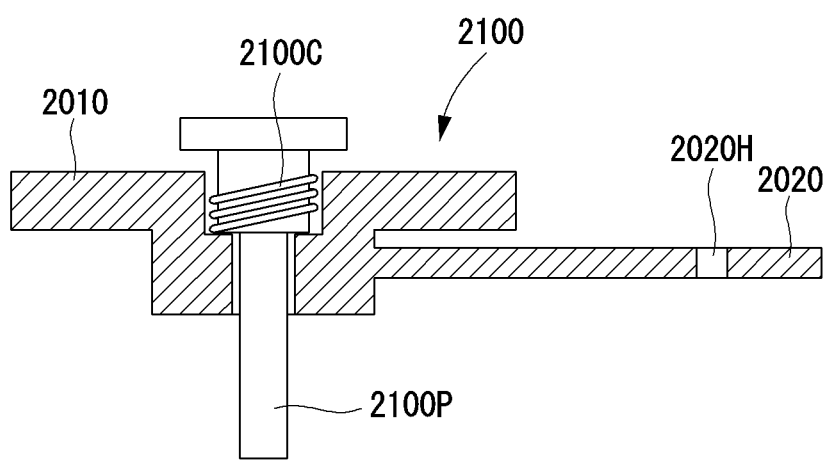

As shown in FIG. 70 showing the cross section of the connection part 2100, the fan 2010 and the extension 2020 may be connected to each other, and a spring 2100C may be installed in the protrusion 2100P.

Hence, when the fan 2010 and/or the extension 2020 rotate using the protrusion 2100P as the shaft, the spring 2100C may be compressed or stretched.

Figure 71:
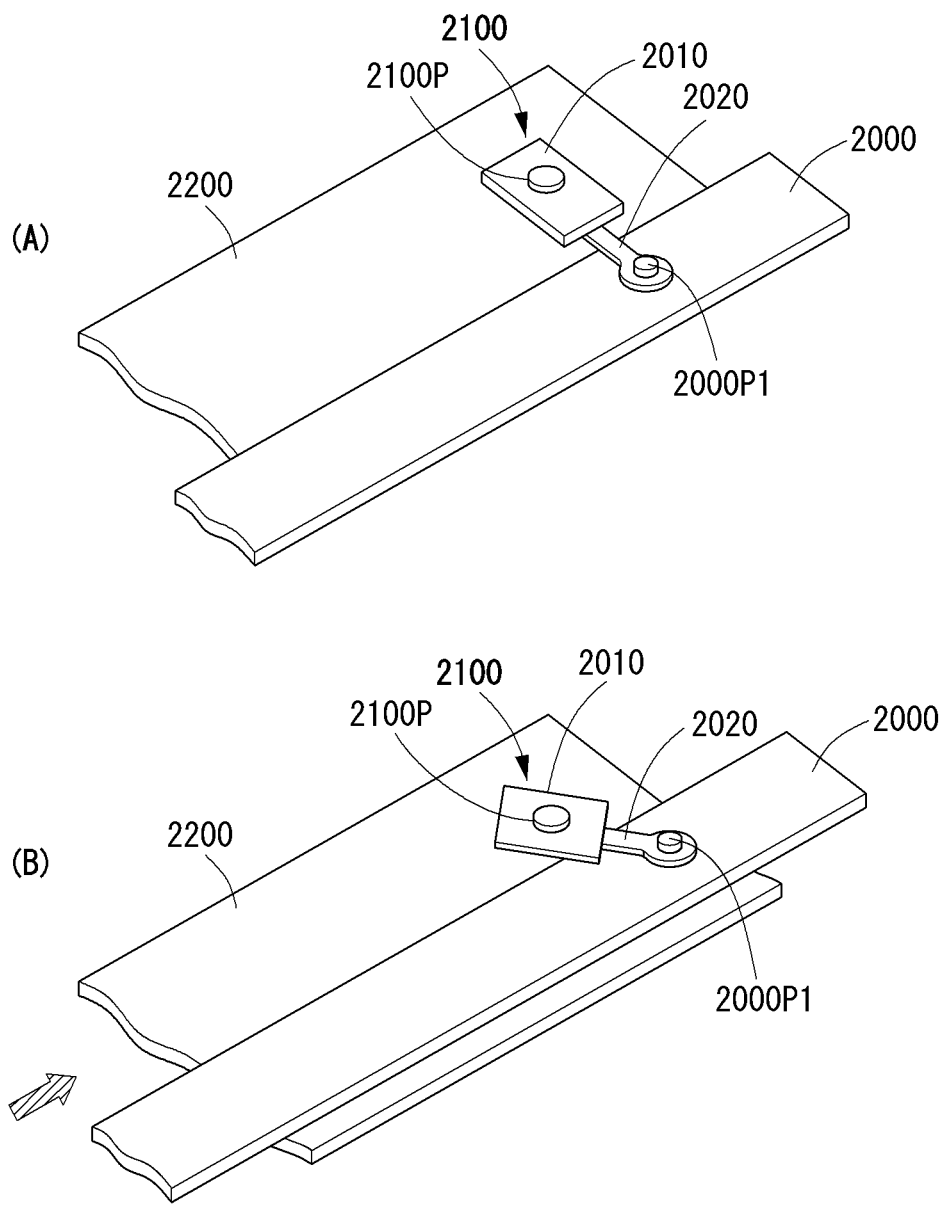

For example, (A) of FIG. 71 shows a state where the spring 2100C is compressed. In this state, as shown in FIG. 52, the fan 2010 may be inserted into the hole 1510 of the supporter 1500 or may be separated from the hole 1510.

In this state, as shown in (B) of FIG. 71, when the user moves the fourth plate 2000 in an arrow direction, the compression of the spring 2100C may be released and stretched.

As shown in (B) of FIG. 71, the fan 2010 may rotate in a state where the fan 2010 is inserted into the hole 1510 of the supporter 1500. In this instance, the fan 2010 may be coupled with the supporter 1500, and thus the frame 1600 may be connected to the back cover 130.

As described above, the fan 2010 may be inserted into the hole 1510 of the supporter 1500 or may be separated from the hole 1510 in a state where the spring 2100C of the connection part 2100 is compressed. Further, the fan 2010 may be coupled with the hole 1510 of the supporter 1500 in a state where the compression of the spring 2100C is released.

When the fan 2010 is connected to the supporter 1500 using the elasticity of the spring 2100C, it may be preferable that the spring 2100C is compressed in the state shown in (A) of FIG. 71.

Figure 72:
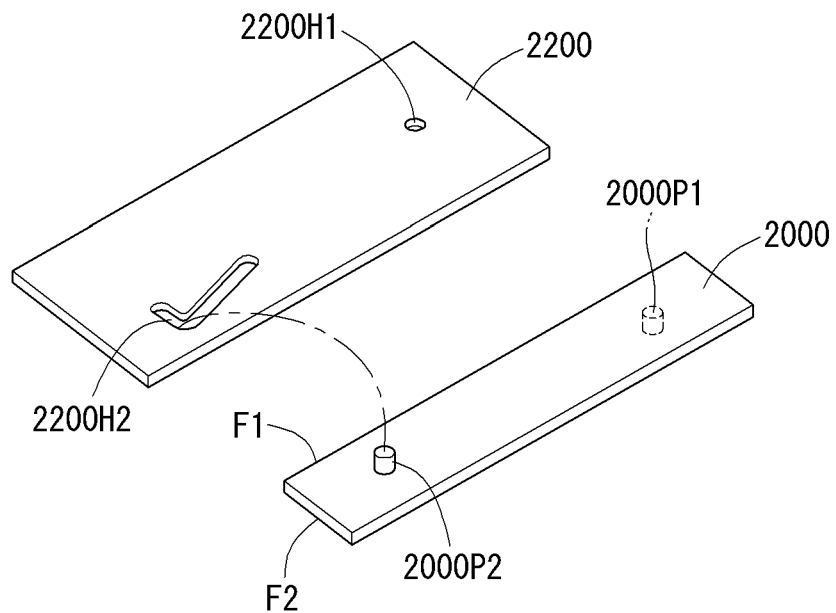

For this, as shown in FIG. 72, the third plate 2200 may include a guide hole 2200H2, and the fourth plate 2000 may include a guide protrusion 2000P2.

For example, the guide protrusion 2000P2 may be formed on a first surface F1 of the fourth plate 2000, and the protrusion 2000P1 of the fourth plate 2000 corresponding to the hole 2020H of the extension 2020 may be formed on a second surface F2 opposite the first surface F1 of the fourth plate 2000.

The third plate 2200 and the fourth plate 2000 may be positioned so that the guide protrusion 2000P2 is movable inside the guide hole 2200H2.

Figure 73:
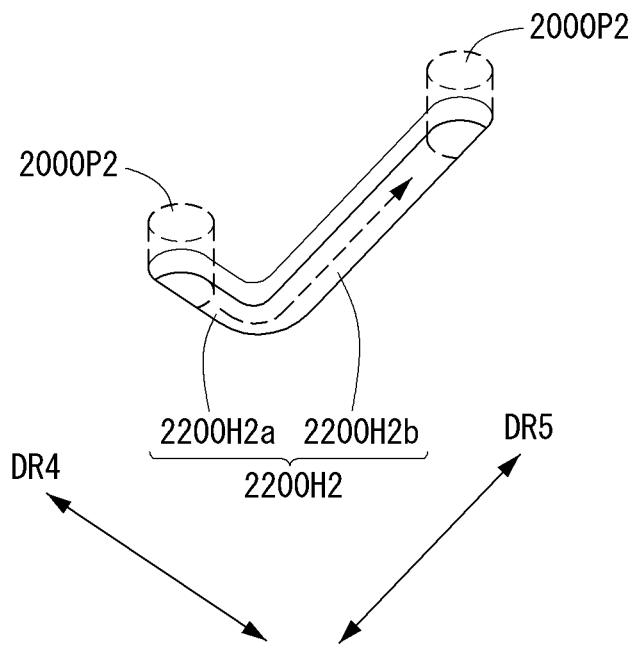

As shown in FIGS. 72 and 73, the guide hole 2200H2 may include a first guide part 2200H2a extending in a fourth direction DR4 and a second guide part 2200H2b extending in a fifth direction DR5 different from the fourth direction DR4.

For example, when the guide protrusion 2000P2 is positioned on the first guide part 2200H2a of the guide hole 2200H2 in a state where the third plate 2200 and the fourth plate 2000 are connected to each other, the spring 2100C may be compressed so as to maintain the state shown in (A) of FIG. 71.

Afterwards, when the guide protrusion 2000P2 moves to the second guide part 2200H2b of the guide hole 2200H2, the compression of the spring 2100C may be released, and thus the spring 2100C may be in the state shown in (B) of FIG. 71.

Figure 74:
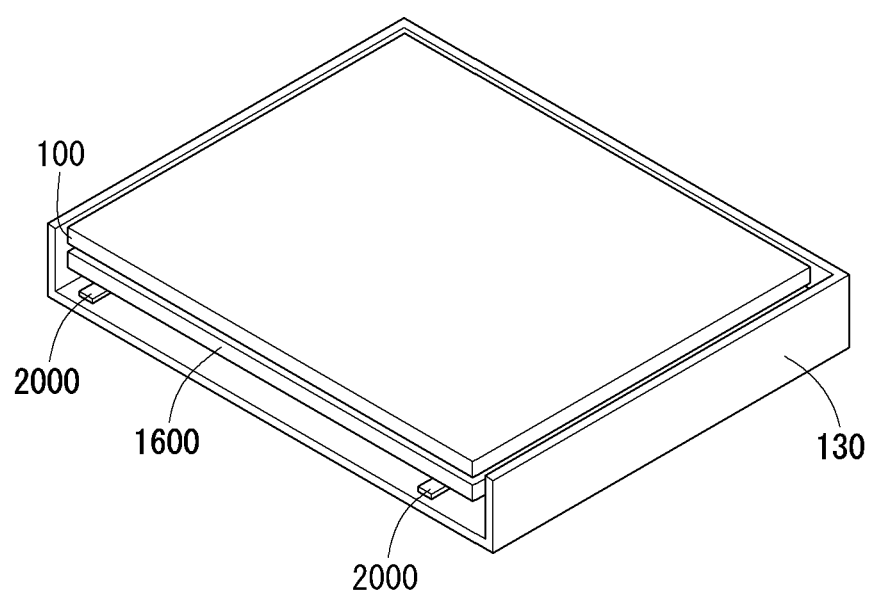

The display module may be connected to the back cover 130 as in FIGS. 52, 53, and 71 by adjusting the fourth plate 2000 in a state where the display module including the display panel 100 and the frame 1600 is disposed on the back cover 130 as shown in FIG. 74.

Figure 75:
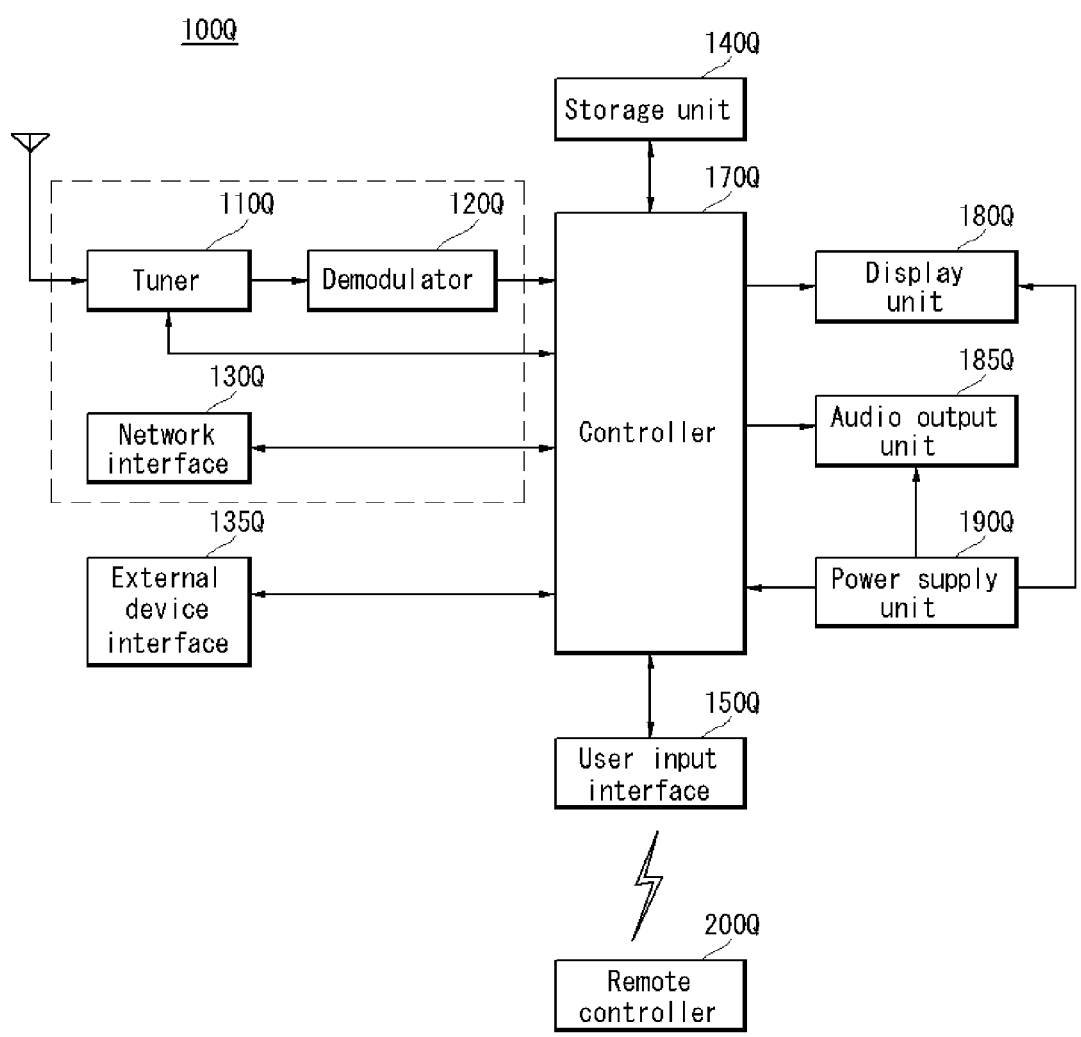
FIG. 75 illustrates configuration of a broadcasting signal receiver including a display device according to an exemplary embodiment of the disclosure.

FIG. 75 illustrates configuration of a broadcasting signal receiver including the display device according to the embodiment of the disclosure. In the following description, the descriptions of the configuration and the structure described above are omitted. Hereinafter, a broadcasting signal receiver is used as an electronic device, to which the display device according to the embodiment of the disclosure is applied. The display device according to the embodiment of the disclosure may be applied to other electronic devices such as cell phones.

A display unit 180Q shown in FIG. 75 may correspond to the display device shown in FIGS. 1 to 74. Thus, the display device according to the embodiment of the disclosure may be referred to as the display unit 180Q shown in FIG. 75.

The driver 300Q shown in FIG. 2 may be included in a controller 170Q which will be described later.

The driving board 830 shown in FIG. 35 may be included in the controller 170Q.

As shown in FIG. 75, a broadcasting signal receiver 100Q according to the embodiment of the disclosure may include a broadcasting receiving unit 105Q, an external device interface 135Q, a storage unit 140Q, a user input interface 150Q, the controller 170Q, a display unit 180Q, an audio output unit 185Q, a power supply unit 190Q, and a photographing unit (not shown). The broadcasting receiving unit 105Q may include a tuner 110Q, a demodulator 120Q, and a network interface 130Q.

If necessary, the broadcasting signal receiver 100Q may be designed so that it includes the tuner 110Q and the demodulator 120Q and does not include the network interface 130Q. On the contrary, the broadcasting signal receiver 100Q may be designed so that it includes the network interface 130Q and does not include the tuner 110Q and the demodulator 120Q.

The tuner 110Q tunes a radio frequency (RF) broadcasting signal, which corresponds to a channel selected by the user or all of previously stored channels, among RF broadcasting signals received through an antenna. Further, the tuner 110Q converts the tuned RF broadcasting signal into a middle frequency signal, a base band image signal, or a voice signal.

The demodulator 120Q receives a digital IF signal converted by the tuner 110Q and performs a demodulating operation.

A stream signal output by the demodulator 120Q may be input to the controller 170Q. The controller 170Q performs demultiplexing, image/voice signal processing, etc. Then, the controller 170Q outputs an image to the display unit 180Q and outputs a voice to the audio output unit 185Q.

The external device interface 135Q may connect an external device to the broadcasting signal receiver 100Q. For this, the external device interface 135Q may include an audio-visual (AV) input/output unit (not shown) or a wireless communication unit (not shown).

The network interface 130Q provides an interface for connecting the broadcasting signal receiver 100Q to a wired/wireless network including an internet network.

The network interface 130Q may correspond to the wireless communication unit, which was described in detail above.

The storage unit 140Q may store a program for the signal processing of the controller 170Q and the control operation of the controller 170Q or may store the processed image signal, the processed voice signal, or a data signal.

The user input interface 150Q may transfer the signal the user inputs to the controller 170Q, or may transfer the signal from the controller 170Q to the user.

For example, the user input interface 150Q may receive and process the control signal indicating the turn-on or turn-off operation, the channel selection, the screen setting, etc. from a remote controller 200Q based on various communication manners such as a RF communication manner and an infrared communication manner. Alternatively, the user input interface 150Q may operate so that the control signal from the controller 170Q is transmitted to the remote controller 200Q.

For example, the user input interface 150Q may transfer a control signal, which is input from a power key, a channel key, a volume key, a local key, etc., to the controller 170Q.

The controller 170Q may perform the demultiplexing processing on the stream input through the tuner 110Q, the demodulator 120Q, or the external device interface 135Q or may perform the processing of demultiplexed signals, thereby generating or outputting the signals for outputting the image or the voice.

The image signal processed by the controller 170Q may be input to the display unit 180Q and may display an image corresponding to the image signal. Further, the image signal processed by the controller 170Q may be input to an external output device through the external device interface 135Q.

The voice signal processed by the controller 170Q may be output to the audio output unit 185Q. Further, the voice signal processed by the controller 170Q may be input to the external output device through the external device interface 135Q.

The controller 170Q may control the entire operation of the broadcasting signal receiver 100Q. For example, the controller 170Q may control the tuner 110Q, so that the tuner 110Q tunes a RF broadcasting signal corresponding to a channel selected by the user or a previously stored channel.

The controller 170Q may control the broadcasting signal receiver 100Q using a user command or an internal program input through the user input interface 150Q.

The display unit 180Q may convert the image signal, the data signal, and an OSD signal, which are processed by the controller 170Q, or the image signal and the data signal which are received from the external device interface 135Q, into red, green, and blue signals and may generate a driving signal.

The audio output unit 185Q may receive the voice signal (for example, stereo signal, 3.1 channel signal, or 5.1 channel signal) processed by the controller 170Q and may output the voice.

The power supply unit 190Q supplies the power required in all of the components of the broadcasting signal receiver 100Q.

The remote controller 200Q transmits the user command the user inputs to the user input interface 150Q. For this, the remote controller 200Q may use Bluetooth, RF communication, infrared communication, Ultra-wideband (UWB), Zigbee, etc.

The remote controller 200Q may receive the image, the voice, or the data signal output from the user input interface 150Q and may display the image, the voice, or the data signal or may output the voice or the vibration.

The broadcasting signal receiver 100Q may not include the tuner 110Q and the demodulator 120Q. Further, the broadcasting signal receiver 100Q may receive image contents through the network interface 130Q or the external device interface 135Q and may reproduce the image contents.

As broadly described and embodied herein, a display device may include a display panel, a frame positioned in the rear of the display panel, a back cover positioned in the rear of the frame, and a fastening part which is positioned between the back cover and the frame and connects the back cover to the frame, wherein the fastening part includes a base part, a moving part which is movably connected to the base part and includes a first hook, a spring part having one end connected to the base part and the other end connected to the moving part, a handle part which is movably connected to the base part and changes a length of the spring part by a rotation of the handle part, and a connection part including a second hook corresponding to the first hook of the moving part.

The base part may be positioned on the back cover, the moving part may be positioned between the back cover and the base part, and the connection part may be positioned on the frame. The base part may be connected to the frame, the moving part may be positioned between the frame and the base part, and the connection part may be positioned on the back cover.

The base part may include a first opening, and the first hook of the moving part may pass through the first opening and may be exposed. The base part may further include a second opening, and the moving part may further include a hole corresponding to the second opening. A fastening member may pass through the second opening and may be fastened to the hole of the moving part. The fastening member may be movable inside the second opening.

The base part may further include a third opening and a third hook, and the moving part may further include a fourth hook which passes through the third opening and is exposed. One end of the spring part may be connected to the third hook, and the other end may be connected to the fourth hook.

The handle part may include a first portion, a first hole formed in the first portion, a second portion connected to the first portion, and a second hole formed in the second portion. The handle part may be movably connected to the base part through the first hole. The moving part may include a protrusion which passes through the first hole and is movable inside the first hole. The first hole of the handle part may include a first extension extending in a first extension direction, and a second extension extending in a second extension direction crossing the first extension direction. When the protrusion of the moving part is positioned on the second extension, an increase state of the length of the spring part may be maintained. A size of the second extension may be less than a size of the first extension.

When the protrusion of the moving part is positioned on the first extension, the length of the spring part may be a first length. When the protrusion of the moving part is positioned on the second extension, the length of the spring part may be a second length longer than the first length. When the protrusion of the moving part is positioned on the first extension, the first hook and the second hook may be engaged with each other. Moreover, the fastening part may be positioned in an area corresponding to short sides of the back cover and the frame.

The display device may further comprise an inner magnet part positioned between the back cover and the frame, and an outer magnet part which is positioned in the rear of the back cover and corresponds to the inner magnet part. The inner magnet part and the outer magnet part may be magnetically coupled with each other with the back cover interposed therebetween. The outer magnet part may be installed on a wall or a structure for hanging the display device. The inner magnet part may be connected to the frame.

The back cover may include a depression depressed toward the frame. A speaker may be disposed on the depression. Moreover, the back cover may include a horizontal part extending in a first direction and a vertical part extending in a second direction crossing the first direction. The vertical part may cover the side of the display panel. A buffer having elasticity may be disposed on an inner surface of the vertical part. Moreover, the vertical part may include a portion which protrudes further than the display panel in the second direction.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a display panel;
    a frame provided adjacent the display panel;
    a back cover provided adjacent the frame; and
    a bracket provided between the back cover and the frame and configured to movably couple the back cover to the frame,
    wherein the bracket includes:
    a base,
    a plate movably coupled to the base and including a first hook,
    a spring coupled between the base and the plate and configured to restrict movement of the plate relative to the base in a first direction,
    a lever coupled to the base and the plate, the lever configured to move the plate relative to the base in the first direction, and
    a rail provided to correspond to the base, the rail including a second hook configured to engage the first hook and one of the rail or the base being provided on a side of the frame opposite the other one of the rail or the base,
    wherein the back cover includes:
    a recess that extends towards the frame, and
    an overhang that extends in a direction opposite to the recess,
    wherein a speaker is provided in the recess on the outer surface of the back cover, and exposed to the outside, and
    wherein the overhang protrudes further than the speaker.

2. The display device of claim 1, wherein the base is provided on the back cover, the plate is provided between the back cover and the base, and the rail is provided on the frame.

3. The display device of claim 1, wherein the base provided on the frame, the plate is provided between the frame and the base, and the rail is provided on the back cover.

4. The display device of claim 1, wherein the base includes a first opening, and the first hook of the plate protrudes through the first opening.

5. The display device of claim 4, wherein the base includes a second opening that extends in the first direction, and the plate includes a guide protrusion that protrudes through the second opening, the guide protrusion being movable in the first direction along the second opening.

6. The display device of claim 5, wherein the base includes a third opening that extends in the first direction and a third hook, and the plate includes a fourth hook that protrudes through the third opening,
    wherein one end of the spring is coupled to the third hook and the other end of the spring is coupled to the fourth hook.

7. The display device of claim 5, wherein the lever includes:
    a first arm,
    a second arm that extends at a prescribed angle from the first arm,
    a first hole formed in the first arm, and
    a second hole formed in the second arm,
    wherein the lever is coupled to the base to rotate about the second hole.

8. The display device of claim 7, wherein the base includes a first protrusion that protrudes through the first hole of the lever and the plate includes a second protrusion that protrudes through the second hole of the lever, the lever rotating about the second protrusion.

9. The display device of claim 8, wherein the first hole of the lever has a prescribed shape that includes:
    a first portion that extends at a first prescribed angle relative to the first arm, and
    a second portion that extends from the first portion at a second prescribed angle relative to the first arm,
    wherein, when the first protrusion is provided along the second portion of the first hole, the plate is moved in the first direction to extend the spring.

10. The display device of claim 9, wherein a length of the second portion of the first hole is less than a length of the first portion.

11. The display device of claim 9, wherein, when the first protrusion is provided along the first portion of the first hole, the plate is moved opposite the first direction to shorten the spring.

12. The display device of claim 11, wherein, when the first protrusion is provided along the first portion of the first hole, the first hook and the second hook are engaged with each other.

13. The display device of claim 1, wherein the bracket is provided in a region that corresponds to a lateral side of the back cover and the frame.

14. The display device of claim 1, further comprising:
    a first magnet provided between the back cover and the frame, and
    a second magnet provided to correspond to the first magnet on an outer surface of the back cover,
    wherein the first magnet and the second magnet are configured to provide an attractive force with each other.

15. The display device of claim 14, wherein the second magnet is coupled to a wall or a structure for hanging the display device.

16. The display device of claim 14, wherein the first magnet is coupled to the frame.

17. The display device of claim 1, wherein the back cover includes a rear surface and a side surface that extends from the rear surface toward the front of the display to cover a lateral side of the display panel.

18. The display device of claim 17, wherein a buffer material is provided on an inner surface of the back cover along at least a portion of the side surface, the buffer material being formed of an elastic material.

19. The display device of claim 17, wherein the side surface protrudes a prescribed distance past a front surface of the display panel.

* * * * *